(12) United States Patent
Kato

(10) Patent No.: US 11,546,993 B2
(45) Date of Patent: Jan. 3, 2023

(54) WIRELESS COMMUNICATION DEVICE AND METHOD OF MANUFACTURING SAME

(71) Applicant: Murata Manufacturing Co., Ltd., Nagaokakyo (JP)

(72) Inventor: Noboru Kato, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 423 days.

(21) Appl. No.: 16/595,897

(22) Filed: Oct. 8, 2019

(65) Prior Publication Data

US 2020/0045821 A1 Feb. 6, 2020

Related U.S. Application Data

(63) Continuation of application No. PCT/JP2019/012481, filed on Mar. 25, 2019.

(30) Foreign Application Priority Data

Jul. 13, 2018 (JP) .............................. JP2018-132909

(51) Int. Cl.
*H05K 1/18* (2006.01)
*H05K 3/46* (2006.01)
(Continued)

(52) U.S. Cl.
CPC ............... *H05K 1/181* (2013.01); *H03H 7/38* (2013.01); *H04B 5/0081* (2013.01); *H05K 1/028* (2013.01);
(Continued)

(58) Field of Classification Search
CPC ................. H05K 1/181; H05K 3/4644; H05K 2201/10098; H05K 2201/0145;
(Continued)

(56) References Cited

U.S. PATENT DOCUMENTS 9,123,996 B2 9/2015 Dokai et al.
10,726,322 B2 * 7/2020 Kato .......................... H01Q 1/48
(Continued)

FOREIGN PATENT DOCUMENTS

JP 2005191705 A 7/2005
JP 2011159212 A 8/2011
(Continued)

OTHER PUBLICATIONS

International Search Report issued for PCT/JP2019/012481, dated Jun. 11, 2019.
(Continued)

*Primary Examiner* — Steven T Sawyer
(74) *Attorney, Agent, or Firm* — ArentFox Schiff LLP

(57) ABSTRACT

A wireless communication device includes a base sheet in a folded state, a first conductor pattern disposed on a first principal surface of the base sheet, a second conductor pattern disposed on a second principal surface of the base sheet opposite to the first principal surface, an RFIC chip disposed on the base sheet so as to electrically connect to the first conductor pattern, and a sheet-shaped connection conductor coupled to a turning part of the base sheet so as to partially overlap with an end portion of the first conductor pattern near the turning part and an end portion of the second conductor pattern near the turning part.

20 Claims, 18 Drawing Sheets

(51) Int. Cl.
*H03H 7/38* (2006.01)
*H04B 5/00* (2006.01)
*H05K 1/02* (2006.01)
*H01Q 1/52* (2006.01)
*H01Q 1/36* (2006.01)

(52) U.S. Cl.
CPC ........... *H05K 1/189* (2013.01); *H05K 3/4644* (2013.01); *H01Q 1/36* (2013.01); *H01Q 1/521* (2013.01); *H05K 2201/10098* (2013.01)

(58) Field of Classification Search
CPC .. H05K 2201/055; H05K 1/118; H05K 1/165; H05K 1/028; H05K 1/189; H05K 2201/056; H05K 2201/09727; H03H 7/38; H04B 5/0081; H01Q 1/36; H01Q 1/521; H01Q 1/2283; H01Q 9/26
See application file for complete search history.

(56) References Cited

U.S. PATENT DOCUMENTS

| | | | | |
|---|---|---|---|---|
| 2005/0230852 | A1* | 10/2005 | Lee | H01L 23/5385 257/E23.07 |
| 2006/0032926 | A1* | 2/2006 | Baba | H01Q 1/2225 235/492 |
| 2006/0145872 | A1* | 7/2006 | Tanaka | G06K 19/07771 340/572.8 |
| 2009/0224061 | A1* | 9/2009 | Kato | G06K 19/07756 235/492 |
| 2011/0048771 | A1* | 3/2011 | Satomi | H05K 1/025 174/254 |
| 2011/0279326 | A1* | 11/2011 | Dokai | H01Q 7/00 343/700 MS |
| 2012/0074229 | A1* | 3/2012 | Osamura | G06K 19/07756 235/492 |
| 2014/0254111 | A1* | 9/2014 | Yamazaki | H01L 51/0097 361/749 |
| 2015/0351222 | A1* | 12/2015 | Baba | H01P 3/082 333/238 |
| 2017/0017873 | A1* | 1/2017 | Baba | H05K 3/284 |
| 2018/0032853 | A1 | 2/2018 | Sugimura et al. | |

FOREIGN PATENT DOCUMENTS

| | | |
|---|---|---|
| JP | 2011244110 A | 12/2011 |
| JP | 5170156 B2 | 3/2013 |
| JP | 2014071585 A | 4/2014 |
| JP | 2018061275 A | 4/2018 |

OTHER PUBLICATIONS

International Search Report issued for PCT/JP2019/012481, dated Jun. 11, 2019 (Japanese language).
Written Opinion of the International Searching Authority issued for PCT/JP2019/012481, dated Jun. 11, 2019.

* cited by examiner

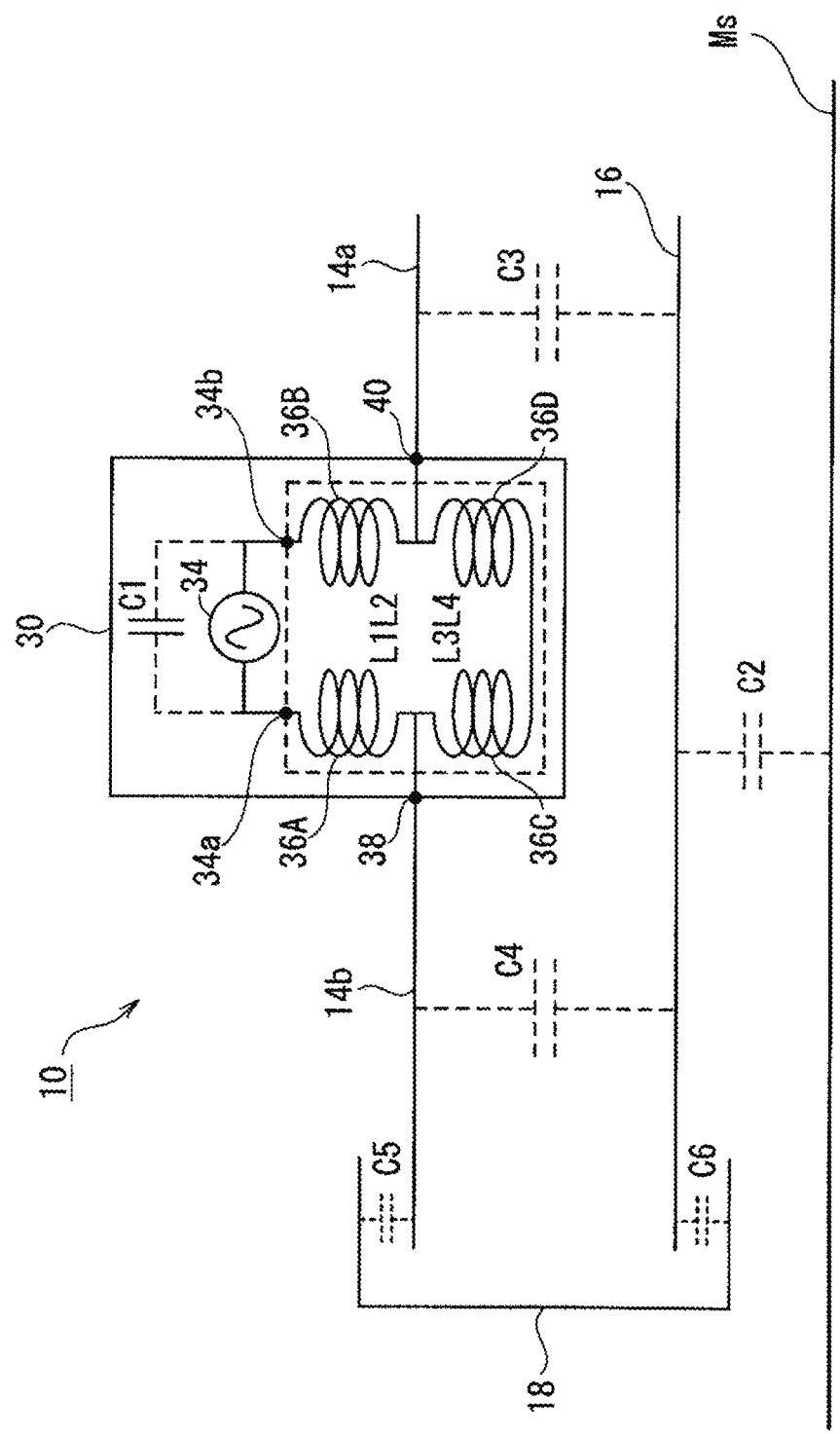

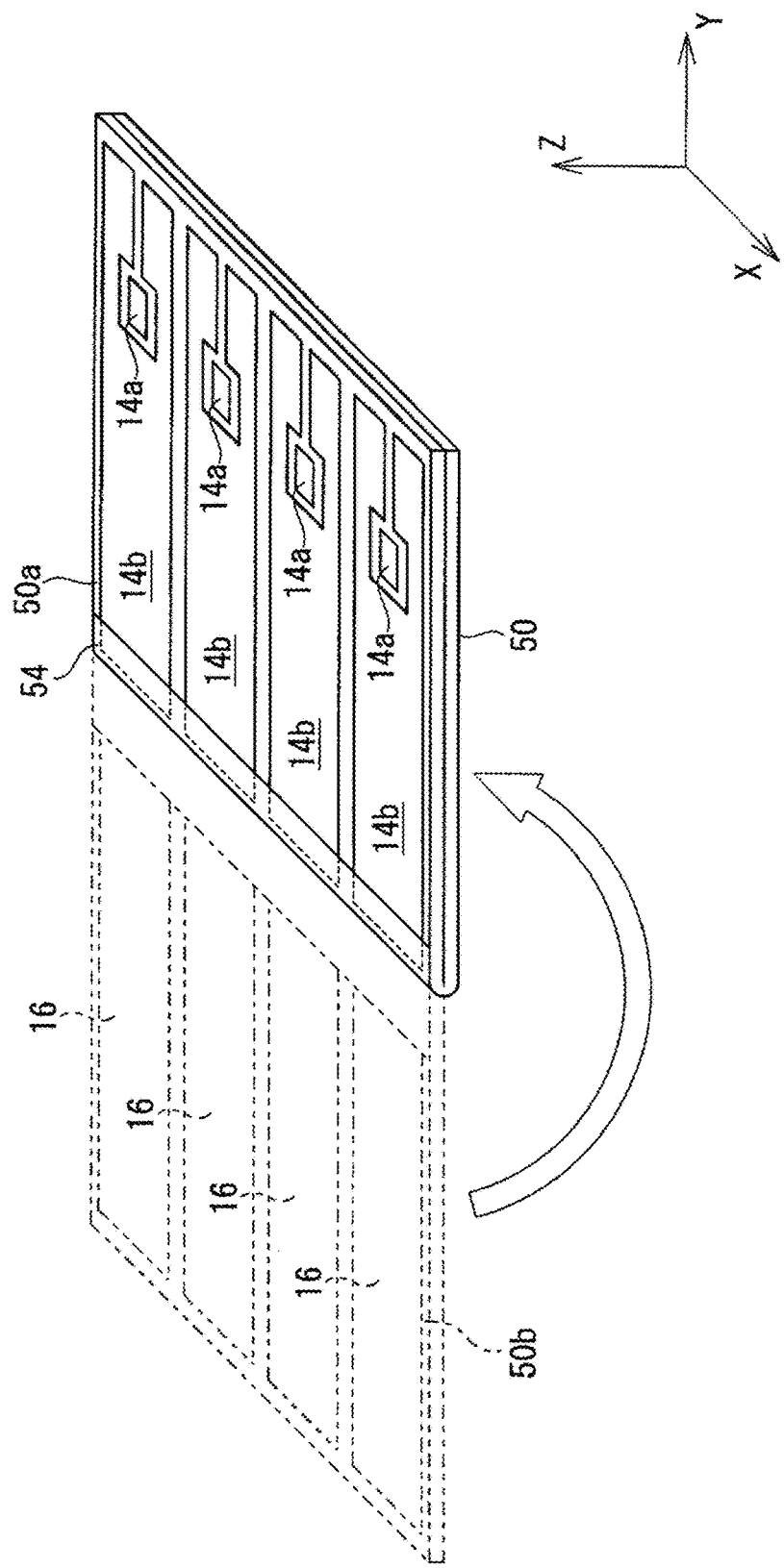

Fig.6
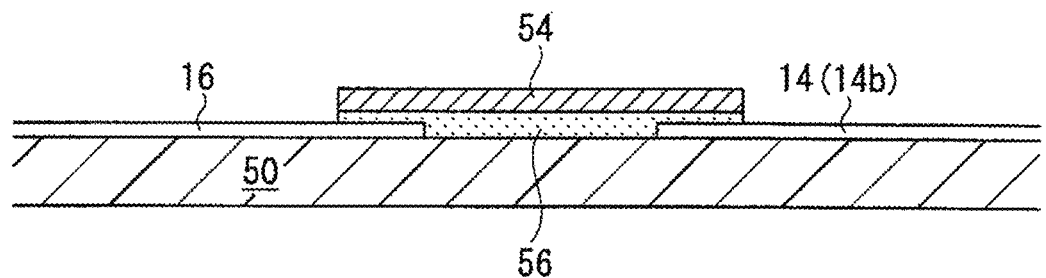
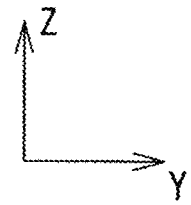
Fig.7A
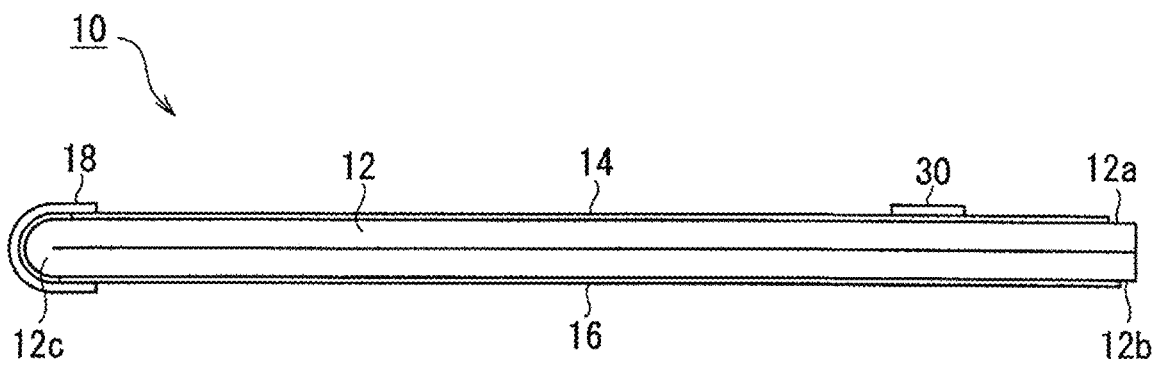
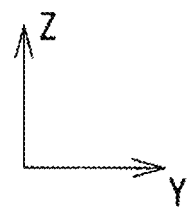

Fig.7B
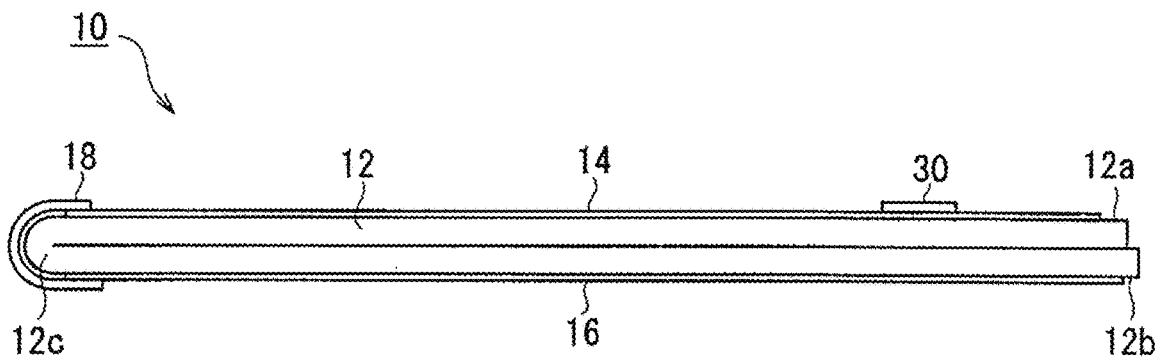
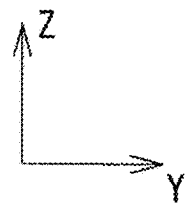
Fig.7C
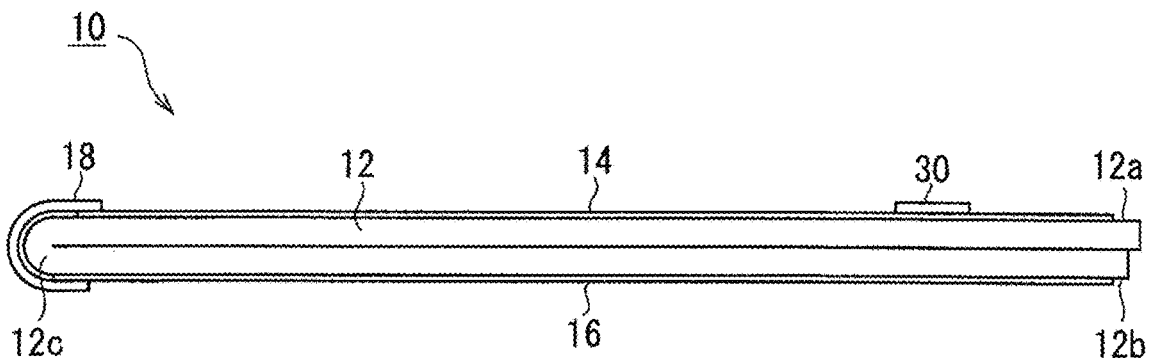
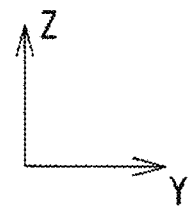

WIRELESS COMMUNICATION DEVICE AND METHOD OF MANUFACTURING SAME

CROSS REFERENCE TO RELATED APPLICATIONS

The present application is a continuation of PCT/JP2019/012481 filed Mar. 25, 2019, which claims priority to Japanese Patent Application No. 2018-132909, filed Jul. 13, 2018, the entire contents of each of which are incorporated herein by reference.

TECHNICAL FIELD

The present invention relates to a wireless communication device configured for wireless communication even when attached to a metal surface of an article, and a method of manufacturing the same.

BACKGROUND

As an example, Patent Document 1 (identified below) describes a conventional wireless communication device that includes two conductor patterns opposite to each other and that is capable of wireless communication even when attached to a metal surface of an article. The wireless communication device described in Patent Document 1 is formed by folding a belt-shaped dielectric element body including a metal pattern substantially on one entire surface with the metal surface facing outward.

Patent Document 1: Japanese Patent No. 5170156.

However, for the wireless communication device described in Patent Document 1, when the wireless communication device is reduced in height, a decrease in thickness of the dielectric element body may cause cracking in a metal pattern on a turning part of the dielectric element body. Specifically, when the dielectric element body is stretched due to folding, the metal pattern is also stretched on the portion, so that cracking or breaking occurs in the metal pattern on the turning part of the dielectric element body. Upon breaking, the wireless communication device can no longer operate, and upon cracking, the inductance value and the resistance value of the metal pattern increase in the turning part, so that the wireless communication device is changed in communication characteristics, for example, communication frequency. Consequently, the communication characteristics vary in a plurality of wireless communication devices depending on the presence/absence or the degree of occurrence of cracking.

SUMMARY OF THE INVENTION

Therefore, the exemplary embodiments of the present invention are provided to suppress occurrence of variations in communication characteristics in a wireless communication device that includes two conductor patterns opposite to each other and that is configured for wireless communication even when attached to a metal surface of an article.

Accordingly, an exemplary aspect of the present invention provides a wireless communication device that includes a base sheet in a folded state; a first conductor pattern disposed on a first principal surface of the base sheet; a second conductor pattern disposed on a second principal surface of the base sheet opposite to the first principal surface; an RFIC chip disposed on the base sheet so as to electrically connect to the first conductor pattern; and a sheet-shaped connection conductor coupled to a turning part of the base sheet so as to partially overlap with an end portion of the first conductor pattern near the turning part and an end portion of the second conductor pattern near the turning part.

Another exemplary aspect of the present invention provides a method of manufacturing a wireless communication device. In this aspect, the manufacturing method includes disposing a first conductor pattern and a second conductor pattern separately at an interval on the same surface of a base sheet; affixing a sheet-shaped connection conductor to a portion of the base sheet located between the first conductor pattern and the second conductor pattern so as to partially overlap with an end portion of the first conductor pattern and an end portion of the second conductor pattern separated at an interval; folding the base sheet together with the connection conductor between the first conductor pattern and the second conductor pattern with the first and second conductor patterns facing outward; affixing portions of the base sheet facing each other due to folding to each other; and disposing an RFIC chip on the base sheet so as to electrically connect to the first conductor pattern.

According to the exemplary embodiments of the present invention, the occurrence of variations in communication characteristics can be suppressed in the wireless communication device that includes two conductor patterns opposite to each other and that is configured for wireless communication even when attached to a metal surface of an article.

BRIEF DESCRIPTION OF DRAWINGS

FIG. 4 is an equivalent circuit diagram of the wireless communication device.

FIG. 5D is a view showing a step following the step of FIG. 5C.

FIG. 6 is a partial cross-sectional view showing attachment of a connection conductor material to a base sheet material.

FIG. 7A is a side view of the wireless communication device with a base sheet folded at a longitudinal center.

FIG. 7B is a side view of the wireless communication device with the base sheet folded at a position shifted from the longitudinal center toward a first conductor pattern.

FIG. 7C is a side view of the wireless communication device with the base sheet folded at a position shifted from the longitudinal center toward a second conductor pattern.

DETAILED DESCRIPTION

Figure 1:
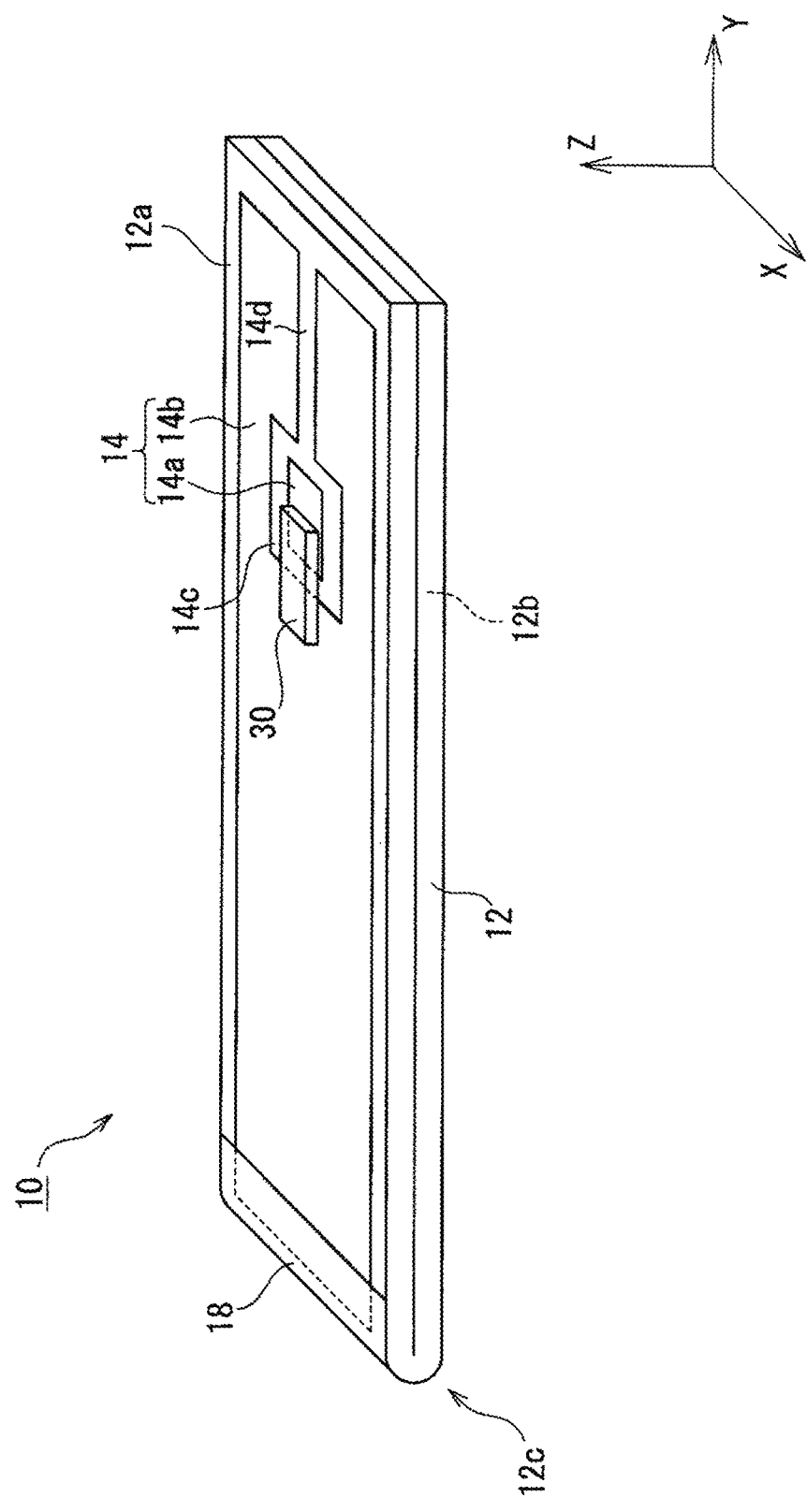
FIG. 1 is a perspective view of a wireless communication device according to an exemplary embodiment of the present invention as viewed from a first principal surface side.

In general, a wireless communication device is provided according to an exemplary aspect of the present invention that includes a base sheet in a folded state, a first conductor pattern disposed on a first principal surface of the base sheet, a second conductor pattern disposed on a second principal surface of the base sheet that is opposite to the first principal surface, an RFIC chip disposed on the base sheet and that is electrically connected to the first conductor pattern, and a sheet-shaped connection conductor affixed to a turning part of the base sheet so as to partially overlap with respective ends of the first and second conductor patterns that are near and/or adjacent to the turning part of the base sheet.

According to the exemplary aspect as described above, occurrence of variations in communication characteristics can be suppressed in the wireless communication device that includes two conductor patterns opposite to each other and that is configured for of wireless communication even when attached to a metal surface of an article.

In an exemplary aspect, the connection conductor can be larger in at least one of thickness and width than the first and second conductor patterns. As a result, even if cracking occurs in the connection conductor, an influence on the communication characteristics of the wireless communication device can be reduced.

In an exemplary aspect, portions of the base sheet facing each other can sandwich an interposed member having a permittivity lower than the base sheet. As a result, a capacity between the first conductor pattern and the second pattern can be reduced, and consequently, the communication distance of the wireless communication device becomes longer.

In an exemplary aspect, the wireless communication device can include an RFIC module including the RFIC chip and a matching circuit, such that the RFIC module is disposed on the base material so that the RFIC chip is electrically connected to the first conductor pattern via the matching circuit.

A method of manufacturing a wireless communication device according to another exemplary aspect of the present invention. In this aspect, the manufacturing method includes disposing a first conductor pattern and a second conductor pattern separately at an interval on the same surface of a base sheet, affixing a sheet-shaped connection conductor to a portion of the base sheet located between the first conductor pattern and the second conductor pattern so as to partially overlap with an end portion of the first conductor pattern and an end portion of the second conductor pattern separated at an interval, folding the base sheet together with the connection conductor between the first conductor pattern and the second conductor pattern with the first and second conductor patterns facing outward, affixing portions of the base sheet facing each other due to folding to each other, and disposing an RFIC chip on the base sheet so as to electrically connect to the first conductor pattern.

According to such an exemplary aspect, occurrence of variations in communication characteristics can be suppressed in the wireless communication device that includes two conductor patterns opposite to each other and that is configured for wireless communication even when attached to a metal surface of an article.

In an exemplary aspect, the connection conductor can be larger in at least one of thickness and width than the first and second conductor patterns. As a result, even if cracking occurs in the connection conductor, an influence on the communication characteristics of the wireless communication device can be reduced.

In an exemplary aspect, portions of the base sheet facing each other can sandwich an interposed member having a permittivity lower than the base sheet. As a result, a capacity between the first conductor pattern and the second pattern can be reduced, and consequently, the communication distance of the wireless communication device becomes longer.

In an exemplary aspect, the wireless communication device can include an RFIC module including the RFIC chip and a matching circuit, such that the RFIC module is disposed on the base material so that the RFIC chip is electrically connected to the first conductor pattern via the matching circuit.

In an exemplary aspect, the connection conductor can be affixed to the base sheet with an adhesive interposed therebetween, and the base sheet may be folded together with the connection conductor before completion of curing of the adhesive. As a result, occurrence of cracking in the connection conductor can be suppressed.

In an exemplary aspect, the second conductor pattern can be larger than the first conductor pattern as viewed in a thickness direction of the base sheet. As a result, even if the folding position of the base sheet is shifted, the entire first conductor pattern can be opposite to the second conductor pattern. Therefore, a capacity between the first conductor pattern and the second conductor pattern can be maintained at a predetermined value, and variations in the communication characteristics of the wireless communication device can be suppressed.

In an exemplary aspect, a groove can be disposed in a portion of the base sheet located between the first and second conductor patterns, and the base sheet may be folded along the groove. As a result, variations in the folding position of the base sheet are suppressed.

In an exemplary aspect, the exemplary method of manufacturing a wireless communication device can further include arranging multiple sets of the first and second conductor patterns on a base sheet material side by side in a direction orthogonal to a direction of arrangement of the first conductor pattern and the corresponding second conductor pattern, affixing a belt-shaped connection conductor material to a portion of the base sheet material located between the first and second conductor patterns so as to partially overlap with an end portion of the first conductor pattern and an end portion of the second conductor pattern separated at an interval in each set, folding the base sheet material together with the connection conductor material between the first conductor pattern and the second conductor pattern in each set with the first and second conductor patterns facing outward, affixing portions of the base sheet material facing each other due to folding to each other, disposing a plurality of the RFIC chips on the base sheet material so as to respectively electrically connect to a plurality of the first conductor patterns, and cutting the base sheet material in a folded state provided with the plurality of the RFIC chips into a plurality of wireless communication devices.

In a refinement of the exemplary aspect, the base sheet material may be a roll sheet.

Exemplary embodiments of the present invention will now be described with reference to the drawings.

Figure 2:
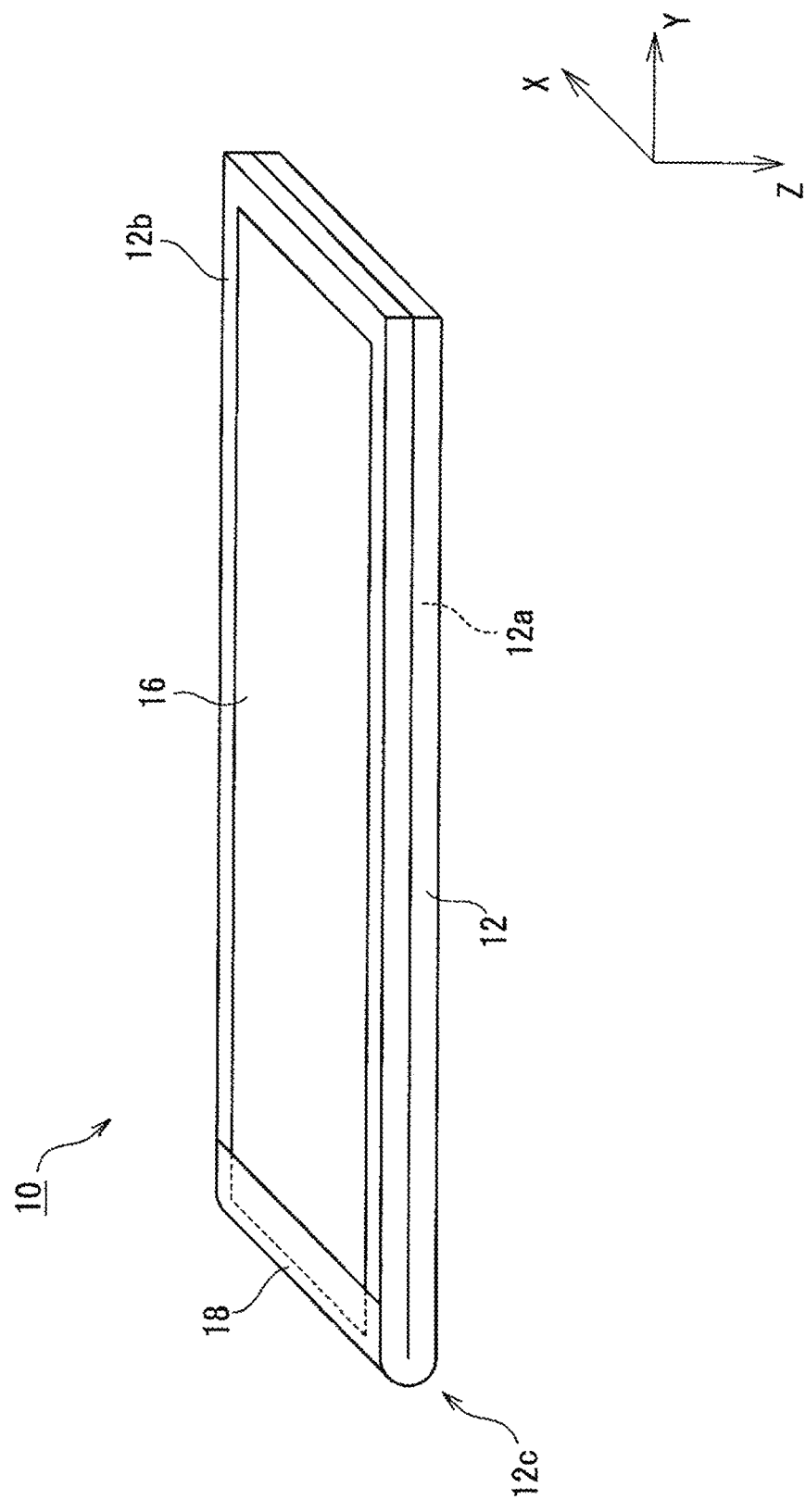
FIG. 2 is a perspective view of the wireless communication device as viewed from a second principal surface side.

FIGS. 1 and 2 are perspective views showing a wireless communication device according to an exemplary embodiment of the present invention. To explain the exemplary embodiment, the figures provide an X-Y-Z coordinate system for facilitating understanding of the invention and do not limit the invention. For example, an X-axis direction indicates a width direction, a Y-axis direction indicates a longitudinal direction, and a Z-axis direction indicates a thickness direction.

As shown in FIG. 1, a wireless communication device 10 according to an embodiment is a so-called RFID (Radio-Frequency IDentification) tag and is the metal-compatible RFID tag 10 configured for wireless communication while being attached to a metal surface of an article such as a metal plate, for example.

As shown in FIGS. 1 and 2, the wireless communication device 10 includes a base sheet 12 and first and second conductor patterns 14, 16 disposed on the base sheet 12. The base sheet 12 also includes a connection conductor 18 electrically connecting the first and second conductor patterns 14, 16, and an RFIC (Radio-Frequency Integrated Circuit) module 30 electrically connected to the first conductor pattern 14.

The base sheet 12 is a sheet-shaped dielectric body, for example, a foamed PET (polyester) film having a thickness of 200 μm. In the case of this exemplary embodiment, the base sheet 12 is in a folded state. Specifically, the belt-shaped base sheet 12 is folded in two, and mutually facing parts thereof are affixed to each other by an insulating adhesive. Therefore, the base sheet 12 is formed into a substrate shape including a first principal surface 12a and a second principal surface 12b opposite to the first principal surface 12a and including a turning part 12c at one end in a longitudinal direction (i.e., the Y-axis direction). In other words, the base sheet 12 includes the U-shaped turning part 12c and a pair of portions extending in substantially the same direction from both respective ends of the turning part 12c and respectively including the first and second principal surfaces 12a, 12b.

The first conductor pattern 14 is a rectangular conductor pattern disposed on the first principal surface 12a of the base sheet 12 and is configured to function as a radiating part of the wireless communication device 10. For example, the first conductor pattern 14 is a pattern of aluminum or copper having a thickness of 5 to 30 μm. In this embodiment, although details will be described later, the first conductor pattern 14 is formed by etching on the first principal surface 12a.

In this embodiment, the first conductor pattern 14 is made up of two parts. Specifically, the first conductor pattern 14 is made up of a first electrode part 14a and a second electrode part 14b surrounding the first electrode part 14a. Specifically, the second electrode part 14b accounts for most of the first conductor pattern 14 from perspective of total surface area of the first conductor pattern 14. The second electrode part 14b is provided with an opening part 14c and a slit part 14d extending from the opening part 14c toward one end in the longitudinal direction (i.e., the Y-axis direction) (the end on the side farther from the turning part 12c). The first electrode part 14a is disposed in the opening part 14c separately at an interval from the second electrode part 14b.

In this embodiment, as shown in FIG. 2, the second conductor pattern 16 is a rectangular conductor pattern disposed on the second principal surface 12b of the base sheet 12 and is configured to function as a connecting part electrically connecting to a metal surface of an article. Specifically, when in a state of being attached to a metal surface of an article, the wireless communication device 10 is attached to the article with the second principal surface 12b facing the metal surface of the article. If the wireless communication device 10 is attached to the metal surface by using an insulating double-sided tape (not shown), the second conductor pattern 16 is capacitively connected (capacitively coupled) to the metal surface via the insulating double-sided tape. Alternatively, if a conductive double-sided tape (not shown) is used, the second conductor pattern 16 is connected through a direct current to the metal surface of the article via the conductive double-sided tape.

As described herein, the term "connection through a direct current" means a connection allowing a direct current to flow between two objects (in this case, the second conductor pattern and the metal surface of the article). On the other hand, the term "capacitive connection" means that although a direct current cannot flow between two objects, the two objects are capacitively coupled by a capacity formed between the two objects instead. The term "electrical connection" generally refers to either of a "connection through a direct current" and/or a "capacitive connection".

In this embodiment, for example, the second conductor pattern 16 is a pattern of aluminum or copper having a thickness of 5 to 30 μm as with the first conductor pattern 14. In the case of this embodiment, although details will be described later, the second conductor pattern 16 is formed by etching on the second principal surface 12b.

In the case of this embodiment, the second conductor pattern 16 is formed larger than the first conductor pattern 14 as viewed in the thickness direction (i.e., the Z-axis direction) of the base sheet 12. Therefore, the second conductor pattern 16 is formed in a size such that the first conductor pattern 14 can be disposed within the contour of the second conductor pattern 16 when viewed in the thickness direction of the base sheet 12. The reason will be described later.

The first conductor pattern 14 disposed on the first principal surface 12a of the base sheet 12 and the second conductor pattern 16 disposed on the second principal surface 12b are electrically connected by the connection conductor 18. Although details will be described later, in this embodiment, the connection conductor 18 capacitively connects to each of the first and second conductor patterns 14, 16 (i.e., a capacity is formed between the connection conductor 18 and the first conductor pattern 14, and a capacity is formed between the connection conductor 18 and the second conductor pattern 16).

Moreover, in the exemplary embodiment, the connection conductor 18 has a sheet shape and is an aluminum film having a thickness of 50 μm, for example. The sheet-shaped connection conductor 18 is affixed to the turning part 12c of the material sheet 12 so as to partially overlap with an end portion of the first conductor pattern 14 near the turning part 12c and an end portion of the second conductor pattern 16 near the turning part 12c. In this embodiment, the connection conductor 18 is bonded to the base sheet 12 by an insulating adhesive such as an acrylic adhesive, for example.

In this embodiment, the width of the connection conductor 18 is larger than the widths of the first and second conductor patterns 14, 16. The width is a size in the direction (i.e., the X-axis direction) orthogonal to the direction of a current flowing sequentially through the first conductor pattern 14, the connection conductor 18, and the second conductor pattern 16 or the backward direction (i.e., the Y-axis direction). Moreover, the thickness of the connection conductor 18 is larger than the thicknesses of the first and second conductor patterns 14, 16. The reason of making the width and thickness of the connection conductor 18 larger than those of the first and second conductor patterns 14, 16 will be described later.

The RFIC module 30 is a module including an RFIC chip and a matching circuit and is disposed on the first principal surface 12*a* of the base sheet 12. The RFIC module 30 is electrically connected to the first conductor pattern 14, or specifically, in the case of this embodiment, the RFIC module 30 is connected through a direct current via solder etc. The RFIC module 30 will be described in more detail.

Figure 3:
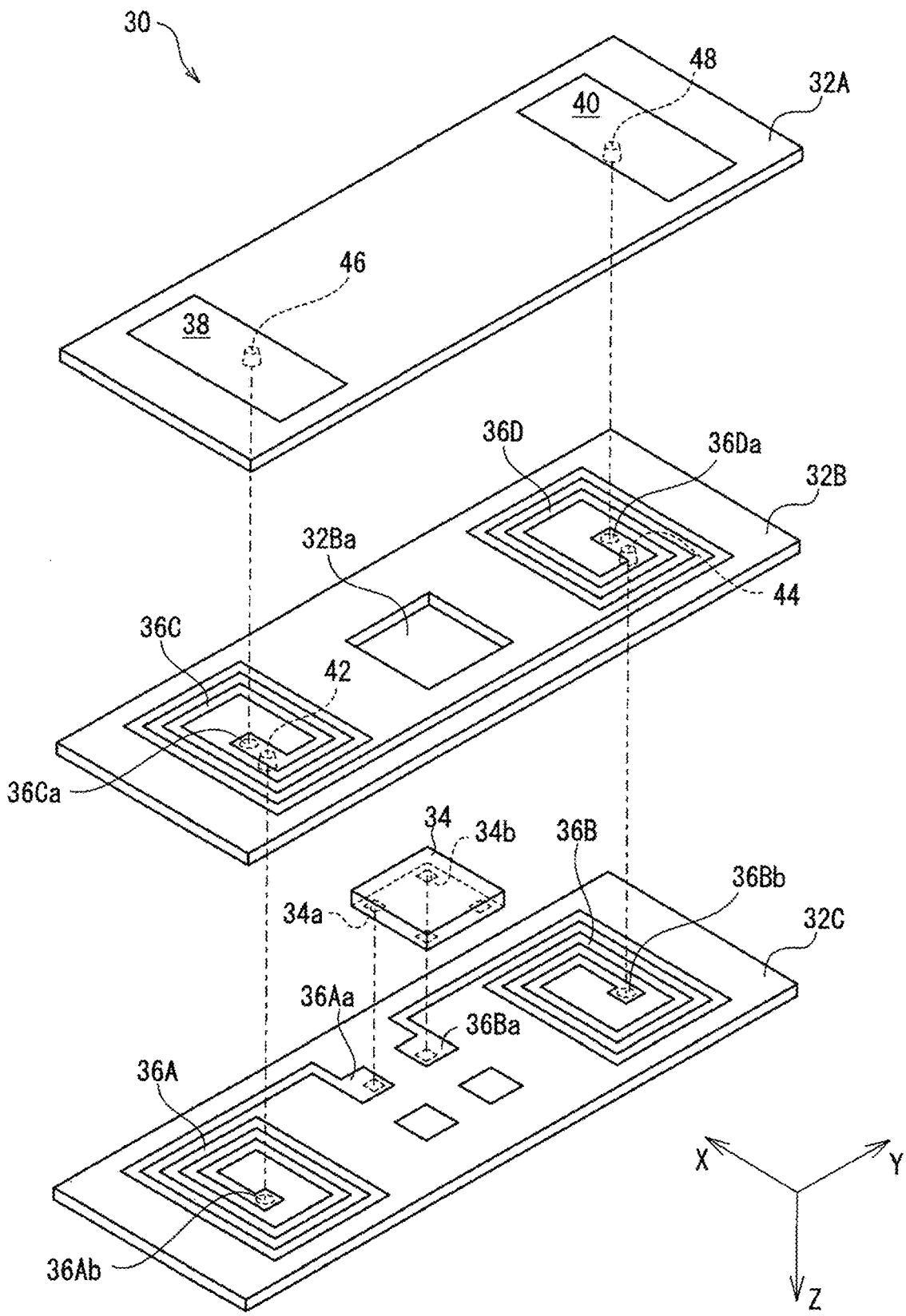
FIG. 3 is an exploded perspective view of an RFIC module.

FIG. 3 is an exploded perspective view of the RFIC module. FIG. 4 is an equivalent circuit diagram of the wireless communication device.

As shown in FIGS. 3 and 4, the RFIC module 30 is a device that is configured to perform wireless communication at a predetermined communication frequency, for example, a communication frequency of, for example, the 900 MHz band, i.e., the UHF band.

As shown in FIG. 3, the RFIC module 30 is made up of a multilayer substrate composed of three layers. Specifically, the RFIC module 30 is formed by laminating flexible insulating sheets 32A, 32B, and 32C made of a resin material such as polyimide and liquid crystal polymer.

As shown in FIG. 3, the RFIC module 30 has an RFIC (Radio-Frequency Integrated Circuit) chip 34, a plurality of inductance elements 36A, 36B, 36C, and 36D, and external connection terminals 38, 40. In the case of the first exemplary embodiment, the inductance elements 36A to 36D and the external connection terminals 38, 40 are formed on the insulating sheets 32A to 32C and are made up of conductor patterns made of a conductive material such as copper.

As shown in FIG. 3, the RFIC chip 34 is mounted on a central part in the longitudinal direction (i.e., the Y-axis direction) on the insulating sheet 32C. The RFIC chip 34 has a structure in which various elements are incorporated in a semiconductor substrate made of a semiconductor such as silicon. The RFIC chip 34 includes a first input/output terminal 34*a* and a second input/output terminal 34*b*. As shown in FIG. 4, the RFIC chip 34 further includes an internal capacity (e.g., capacitance: a self-capacity of the RFIC chip itself) C1.

As shown in FIG. 3, the inductance element (e.g., a first inductance element) 36A is made up of a conductor pattern disposed in a spiral coil shape on the insulating sheet 32C on one side in the longitudinal direction (i.e., the Y-axis direction) of the insulating sheet 32C. As shown in FIG. 4, the inductance element 36A includes an inductance L1. One end (e.g., an end on the coil outer side) of the inductance element 36A is provided with a land 36Aa connected to the first input/output terminal 34*a* of the RFIC chip 34. The other end (e.g., an end on the coil center side) is provided with a land 36Ab.

As shown in FIG. 3, the inductance element (e.g., second inductance element) 36B is made up of a conductor pattern disposed in a spiral coil shape on the insulating sheet 32C on the other side in the longitudinal direction (i.e., the Y-axis direction) of the insulating sheet 32C. As shown in FIG. 4, the inductance element 36B includes an inductance L2. One end (e.g., an end on the coil outer side) of the inductance element 36B is provided with a land 36Ba connected to the second input/output terminal 34*b* of the RFIC chip 34. The other end (e.g., an end on the coil center side) is provided with a land 36Bb.

As shown in FIG. 3, the inductance element (e.g., third inductance element) 36C is made up of a conductor pattern disposed in a spiral coil shape on the insulating sheet 32B on one side in the longitudinal direction (i.e., the Y-axis direction) of the insulating sheet 32B. The inductance element 36C is opposite to the inductance element 36A in the lamination direction (i.e., the Z-axis direction). As shown in FIG. 4, the inductance element 36C includes an inductance L3. One end (e.g., an end on the coil outer side) of the inductance element 36C is provided with a land 36Ca. The land 36Ca is connected to the land 36Ab of the inductance element 36A on the insulating sheet 32C via an interlayer connection conductor 42 such as a through-hole conductor penetrating the insulating sheet 32B.

As shown in FIG. 3, the inductance element (e.g., a fourth inductance element) 36D is made up of a conductor pattern disposed in a spiral coil shape on the insulating sheet 32B on the other side in the longitudinal direction (Y-axis direction) of the insulating sheet 32B. The inductance element 36D is opposite to the inductance element 36B in the lamination direction (i.e., the Z-axis direction). Additionally, as shown in FIG. 4, the inductance element 36D includes an inductance L4. One end (e.g., an end on the coil outer side) of the inductance element 36D is provided with a land 36Da. The land 36Da is connected to the land 36Bb of the inductance element 36B on the insulating sheet 32C via an interlayer connection conductor 44 such as a through-hole conductor penetrating the insulating sheet 32B.

The inductance elements 36C, 36D on the insulating sheet 32B are integrated as one conductor pattern. Specifically, the respective other ends (e.g., ends on the coil outer side) are connected to each other. The insulating sheet 32B is provided with a through-hole 32Ba in which the RFIC chip 34 mounted on the insulating sheet 32C is received.

As shown in FIG. 3, the external connection terminals 38, 40 are made up of conductor patterns disposed on the insulating sheet 32A. The external connection terminals 38, 40 are opposite in the longitudinal direction (i.e., the Y-axis direction) of the insulating sheet 32A.

The one external connection terminal 38 is connected to the land 36Ca of the inductance element 36C on the insulating sheet 32B via an interlayer connection conductor 46 such as a through hole conductor penetrating the insulating sheet 32A.

The other external connection terminal 40 is connected to the land 36Da of the inductance element 36D on the insulating sheet 32B via an interlayer connection conductor 48 such as a through hole conductor penetrating the insulating sheet 32A.

As shown in FIG. 4, the one external connection terminal 38 is electrically connected via, for example, solder to the second electrode part 14*b* of the first conductor pattern 14. Similarly, the other external connection terminal 40 is electrically connected via, for example, a solder to the first electrode part 14*a* of the first conductor pattern 14.

The RFIC chip 34 is made up of a semiconductor substrate. The RFIC chip 34 is present between the inductance elements 36A, 36B and between the inductance elements 36C, 36D. The RFIC chip 34 functions as a shield, so that magnetic-field coupling and capacitive coupling are suppressed between the inductance elements 36A, 37B having the spiral coil shape disposed on the insulating sheet 32C. Similarly, magnetic-field coupling and capacitive coupling are suppressed between the inductance elements 36C, 36D having the spiral coil shape disposed on the insulating sheet 32B. As a result, a passband of communication signals is prevented from narrowing.

As shown in FIG. 4, the capacity C1 (e.g., an internal capacity of the RFIC chip 34) and the inductances L1 to L4 (e.g., inductances of four inductance elements) form a matching circuit for matching between the RFIC chip 34 and conductors on the outside thereof (i.e., the first conductor pattern 14, the second conductor pattern 16, and the connection conductor 18) so that resonance occurs at a predetermined communication frequency.

According to the configuration described above, the wireless communication device 10 is configured to exchange radio waves with an external wireless communication apparatus (e.g., a reader/writer apparatus) substantially via the first conductor pattern 14 when the device is not attached to an article, or substantially via the first conductor pattern 14 and a metal surface Ms when the device is attached to the metal surface Ms as shown in FIG. 4. Therefore, the metal surface Ms functions as an antenna. In FIG. 4, the second conductor pattern 16 is capacitively connected to the metal surface Ms (i.e., a capacity C2 is formed therebetween).

For example, when radio waves are received via the first conductor pattern 14 or the metal surface Ms, an electromotive force is generated therein, and the RFIC chip 34 of the RFIC module 30 is driven by the electromotive force. The driven RFIC chip 34 transmits data stored in a storage part thereof via the first conductor pattern 14 or the metal surface Ms.

In the wireless communication device 10, the first conductor pattern 14 (e.g., the first and second electrode parts 14a, 14b) and the second conductor pattern 16 are maintained at a constant distance (e.g., twice the thickness of the base sheet 12). Therefore, a capacity C3 between the first electrode part 14a of the first conductor pattern 14 and the second conductor pattern 16 is constant, and a capacity C4 between the second electrode part 14b and the second conductor pattern 16 is constant. As such, even if the wireless communication device 10 is attached to the metal surface Ms of the article, i.e., even if the second conductor pattern 16 and the metal surface Ms are electrically connected, the wireless communication device 10 is nearly unchanged in electrical characteristics, particularly in the capacities C3, C4 as compared to before the connection. As a result, the resonance frequency of the wireless communication device 10 does not substantially change as compared to before attachment to the metal surface Ms. When the device is attached to the metal surface Ms, the metal surface Ms can be used as an antenna, so that the communication distance becomes longer.

A method of manufacturing the wireless communication device 10 according to this embodiment will hereinafter be described.

FIGS. 5A to 5E each show a step in a method of manufacturing a wireless communication device.

Figure 5A:
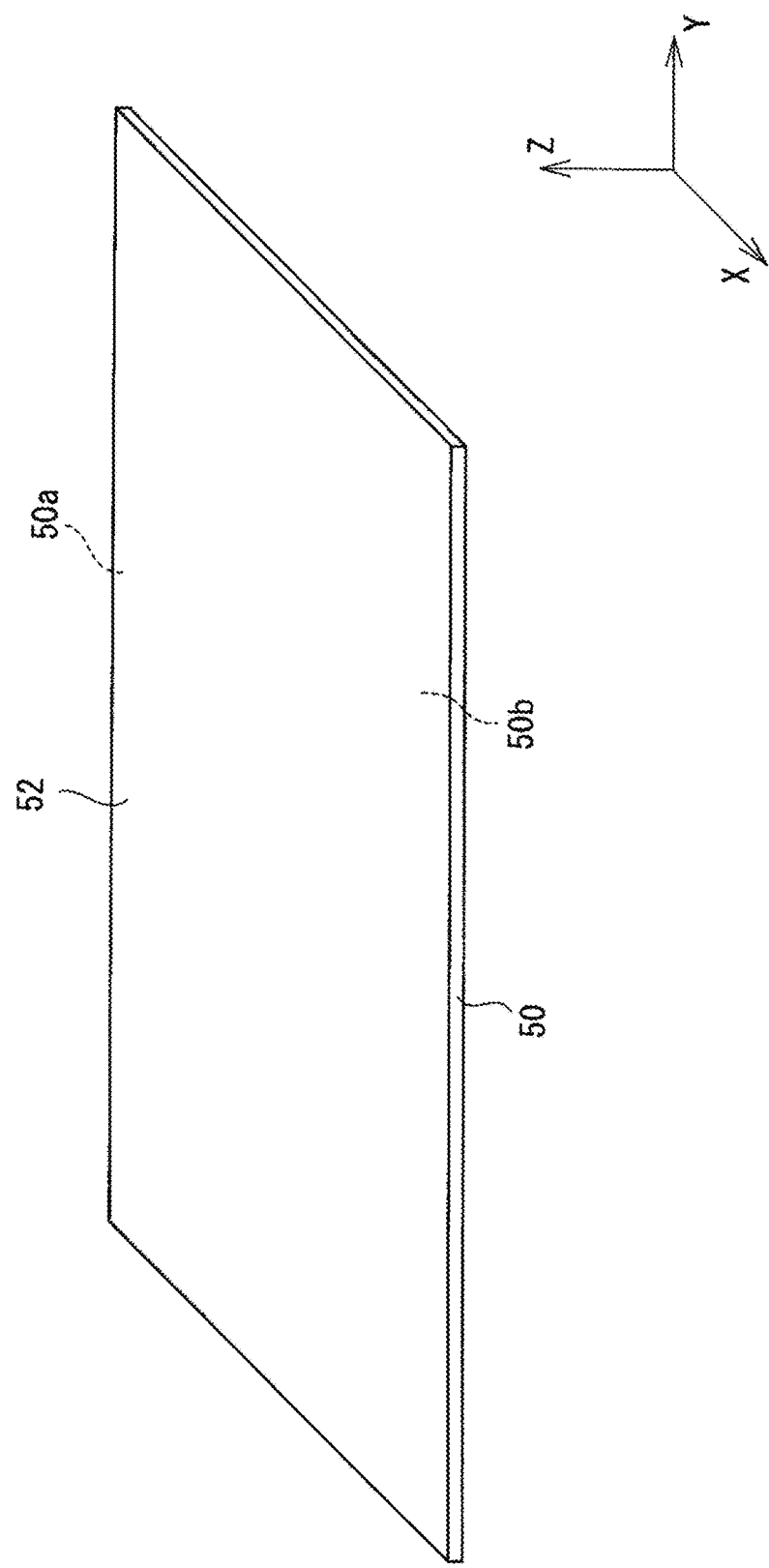
FIG. 5A a view showing a step in a method of manufacturing a wireless communication device.

As shown to FIG. 5A, a conductor layer 52 of aluminum, copper, etc. is formed on one entire surface 50a of a base sheet material 50. The base sheet material 50 is cut into multiple pieces in a later step and processed into the base sheet 12 of the wireless communication device 10.

Figure 5B:
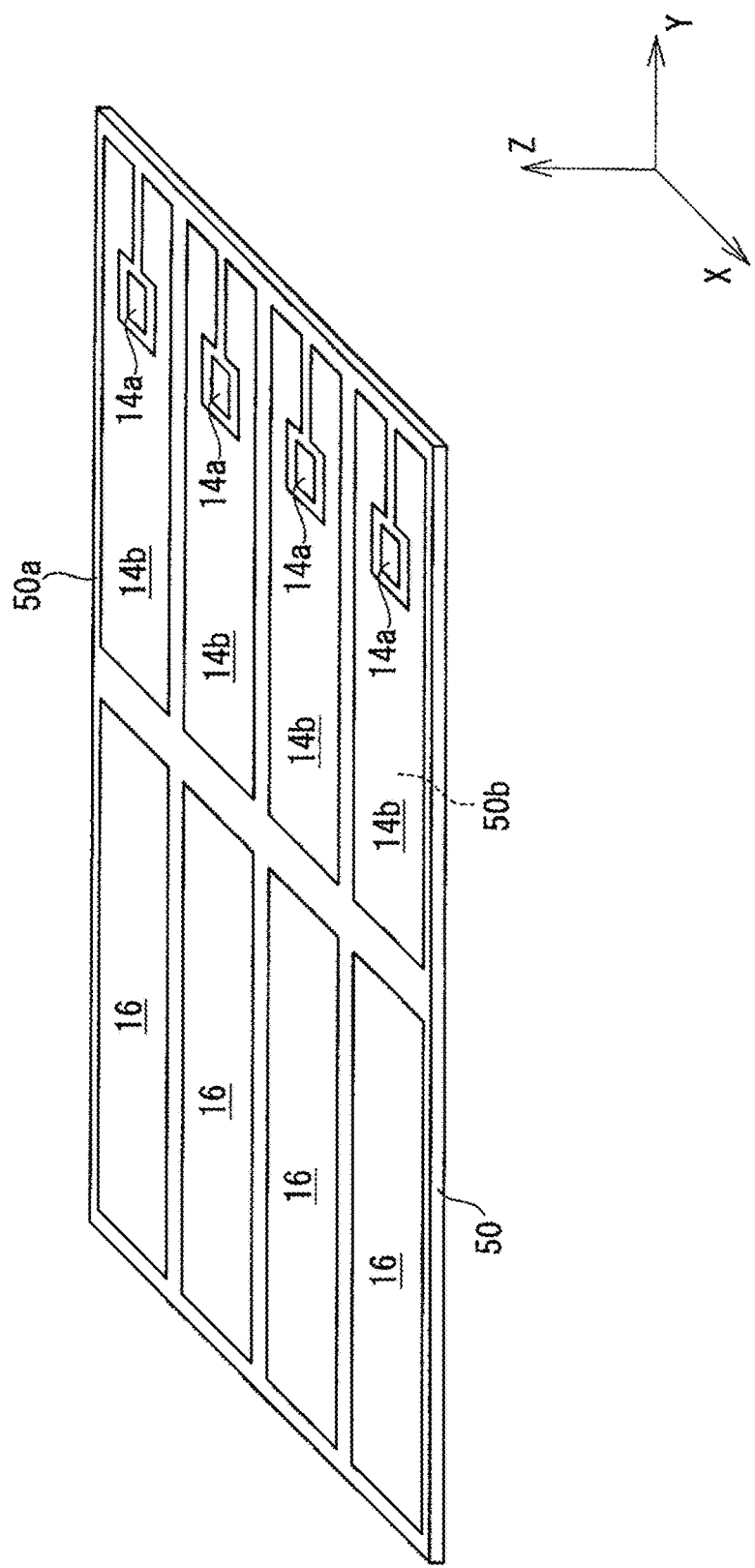
FIG. 5B is a view showing a step following the step of FIG. 5A.

Subsequently, as shown in FIG. 5B, the conductor layer 52 is processed by, for example, etching, into the first conductor pattern 14 (i.e., the first and second electrode parts 14a, 14b) and the second conductor pattern 16. In this example, four sets of the first and second conductor patterns 14, 16 are formed. In each of the sets, the first conductor pattern 14 and the second conductor pattern 16 are disposed on the base sheet material 50 separately at an interval on the same surface. The multiple sets of the first and second conductor patterns 14, 16 are arranged side by side in the direction (i.e., the X-axis direction) orthogonal to the direction (i.e., the Y-axis direction) of arrangement of the first conductor pattern 14 and the corresponding second conductor pattern 16.

Figure 5C:
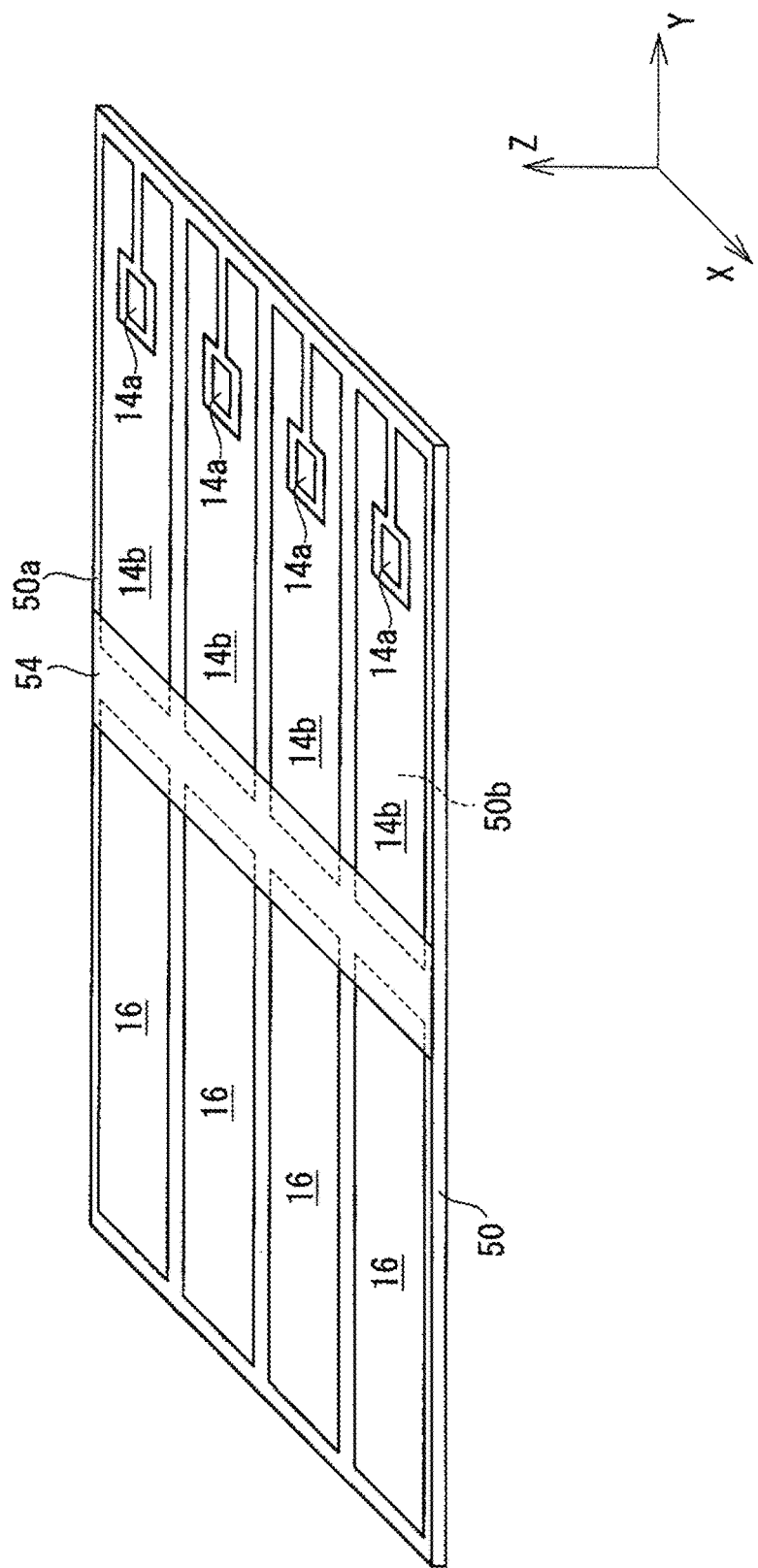
FIG. 5C is a view showing a step following the step of FIG. 5B.

Subsequently, as shown in FIG. 5C, a belt-shaped connection conductor material 54 such as an aluminum film is affixed to the base sheet material 50. The connection conductor material 54 is cut into multiple pieces in a later step and processed into the connection conductor 18. Specifically, as shown in FIG. 6 that is a partial cross-sectional view showing attachment of the connection conductor material to the base sheet material, the connection conductor material 54 is affixed via an insulating adhesive, such as an acrylic adhesive, or an insulating sticky material 56.

Specifically, as shown in FIG. 6, the connection conductor material 54 is affixed via the insulating adhesive 56 in a portion of the base sheet material 50 located between the first and second conductor patterns 14, 16 so as to partially overlap with an end portion of the first conductor pattern 14 and an end portion of the second conductor pattern 16 separated at an interval in each set. Consequently, as shown in FIG. 4, the connection conductor material 54 (i.e., the connection conductor 18) and the first conductor pattern 14 (e.g., the second electrode part 14b thereof) are capacitively connected (i.e., a capacity C5 is formed therebetween), and the connection conductor 18 and the second conductor pattern 16 are capacitively connected (i.e., a capacity C6 is formed therebetween).

Subsequently, as shown in FIG. 5D, the base sheet material 50 is folded together with the connection conductor material 54 between the first conductor pattern 14 and the second conductor pattern 16 in each set with the first and second conductor patterns 14, 16 facing outward. Portions of the base sheet material 50 facing each other due to folding (i.e., the other folded surface 50b) are affixed to each other via an insulating adhesive.

If the adhesive used for affixing the connection conductor material 54 to the base sheet material 50 as shown in FIG. 6 requires a time (e.g., 24 hours) for complete curing, the base sheet material 50 is preferably folded together with the connection conductor material 54 before completion of curing of the adhesive.

In contrast, if the base sheet material 50 is folded after completion of the curing of the adhesive interposed between the base sheet material 50 and the connection conductor material 54, the base sheet material 50 is stretched due to folding, and the connection conductor material 54 is also stretched. In this case, the connection conductor material 54 is fixed to the base sheet material 50 by the completely cured adhesive and is therefore continuously subjected to a tensile force from the base sheet material 50. Therefore, cracking easily occurs in the connection conductor material 54.

To prevent the connection conductor material 54 from being subjected to the tensile force from the base sheet material 50 after folding, the base sheet material 50 is preferably folded together with the connection conductor material 54 before the adhesive is completely cured, i.e., while the connection conductor material 54 can slide relative to the base sheet material 50. As a result, the occurrence of cracking in the connection conductor material 54 (the connection conductor 18) can advantageously be suppressed. Additionally, by changing the insulating adhesive 56 to the insulating sticky material, the time until curing of the adhesive material becomes longer, so that the time after the affixing processing of the connection conductor material 54 until the folding processing can be made longer.

Figure 5E:
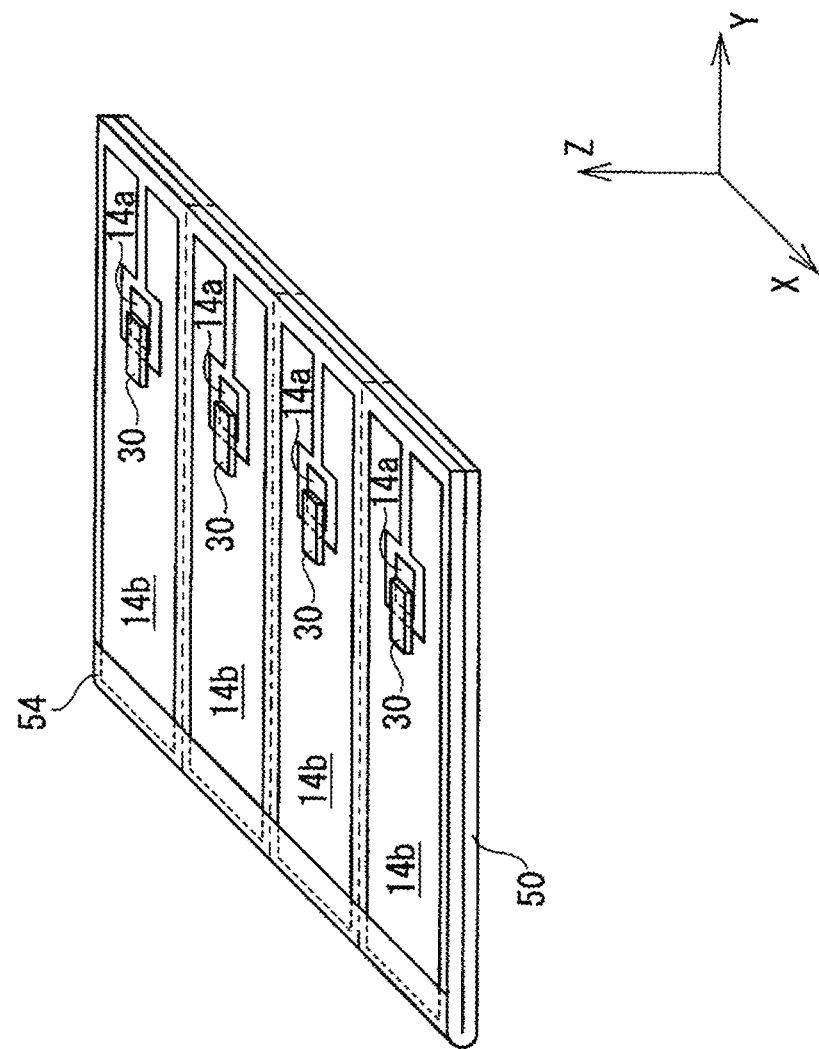
FIG. 5E is a view showing a step following the step of FIG. 5D.

Subsequently, as shown in FIG. 5E, the multiple RFIC modules 30 are disposed on the base sheet material 50 so as to electrically connect to the multiple respective first conductor patterns 14. The base sheet material 50 in a folded state provided with the multiple RFIC modules 30 is cut into multiple pieces, and a plurality of the wireless communication devices 10 shown in FIGS. 1 and 2 is produced.

The base sheet material 50 shown in FIGS. 5A to 5E is a cut sheet or may be a roll sheet.

When the base sheet material 50 is a roll sheet, the steps shown in FIGS. 5A to 5E are performed in order on a sheet portion pulled out from the roll. In this case, the base sheet material 50 in a folded state provided with the multiple RFIC modules 30 may be wound into a roll again without being cut into multiple pieces. In this embodiment, a method of folding a sheet portion pulled out from the roll in the width direction is not limited.

According to this exemplary embodiment as described above, occurrence of variations in communication characteristics can be suppressed in the wireless communication device that includes two conductor patterns opposite to each other and that is configured for wireless communication even when attached to a metal surface of an article.

Specifically, as shown in FIGS. 1 and 2, the first conductor pattern 14 on the first principal surface 12a of the base sheet 12 and the second conductor pattern 16 on the second principal surface 12b are electrically connected by the connection conductor 18 that is a member different therefrom.

Therefore, as in this embodiment, the connection conductor 18 larger in width and thickness than the first and second conductor patterns 14, 16 is usable. Additionally, the thickness of the connection conductor 18 can be made thicker than the first and second conductor patterns 14, 16 to achieve a thickness at which an electrode hardly cracks due to folding, or the insulating adhesive 56 can be changed to the insulating sticky material to make the connection conductor 18 slidable during the folding processing so that no tensile stress is applied to the connection conductor 18.

A conductive film acquired by mixing a conductive filler with an elastic base material can be used as a material that is easily stretchable, i.e., a material that hardly cracks, as compared to the first and second conductor patterns 14, 16, for producing the connection conductor 18.

Furthermore, as in this embodiment, the connection conductor 18 and the first and second conductor patterns 14, 16 can capacitively be connected. As shown in FIG. 4, by adjusting the capacities C5, C6 generated therebetween, i.e., by adjusting the areas of the portions of the connection conductor 18 facing the first and second conductor patterns 14, 16, the communication frequency of the wireless communication device 10 can be adjusted.

As described above, by electrically connecting the first and second conductor patterns 14, 16 opposite to each other via the connection conductor 18 different therefrom, the occurrence of variations in communication characteristics can be suppressed in the multiple wireless communication devices 10.

In this embodiment, as described above, the second conductor pattern 16 is formed larger than the first conductor pattern 14 as viewed in the thickness direction (i.e., the Z-axis direction) of the base sheet 12. Therefore, even if variation occurs in the folding position, the capacities C3, C4 between the first conductor pattern 14 and the second conductor pattern 16 can be maintained at predetermined values as shown in FIG. 4. This will be specifically described.

FIG. 7A to 7C each show a wireless communication device with a base sheet folded at a different position.

FIG. 7A shows the wireless communication device 10 with the base sheet 12 folded at the center in the longitudinal direction (i.e., the Y-axis direction), i.e., with both ends of the base sheet 12 made coincide on the side opposite to the turning part 12c. In this case, the entire first conductor pattern 14 faces the second conductor pattern 16.

FIG. 7B shows the wireless communication device 10 with the base sheet 12 folded at a position shifted toward the first conductor pattern 14 relative to the center in the longitudinal direction (i.e., the Y-axis direction), i.e., with both ends of the base sheet 12 shifted. Even in this case, since the second conductor pattern 16 is formed larger than the first conductor pattern 14, the entire first conductor pattern 14 can be opposite to the second conductor pattern 16.

FIG. 7C shows the wireless communication device 10 with the base sheet 12 folded at a position shifted toward the second conductor pattern 16 relative to the center in the longitudinal direction (i.e., the Y-axis direction), i.e., with both ends of the base sheet 12 shifted. Even in this case, since the second conductor pattern 16 is formed larger than the first conductor pattern 14, the entire first conductor pattern 14 can be opposite to the second conductor pattern 16.

As shown in FIGS. 7A to 7C, even if variations occur in the folding position of the base sheet 12, the second conductor pattern 16 is formed larger than the first conductor pattern 14, so that the entire conductor pattern 14 can be opposite to the second conductor pattern 16. As a result, even if variations occur in the folding position, the capacities C3, C4 between the first conductor pattern 14 and the second conductor pattern 16 can be maintained at predetermined values. Consequently, the occurrence of variations in communication characteristics can be suppressed in the wireless communication device.

If the folded portion of the base sheet 12 may possibly be shifted in the width direction (i.e., the X-axis direction) of the wireless communication device 10 relative to the remaining portion, the width (e.g., size in the X-axis direction) of the second conductor pattern 16 is preferably made larger than the width 18 of the first conductor pattern 14.

Figure 8:
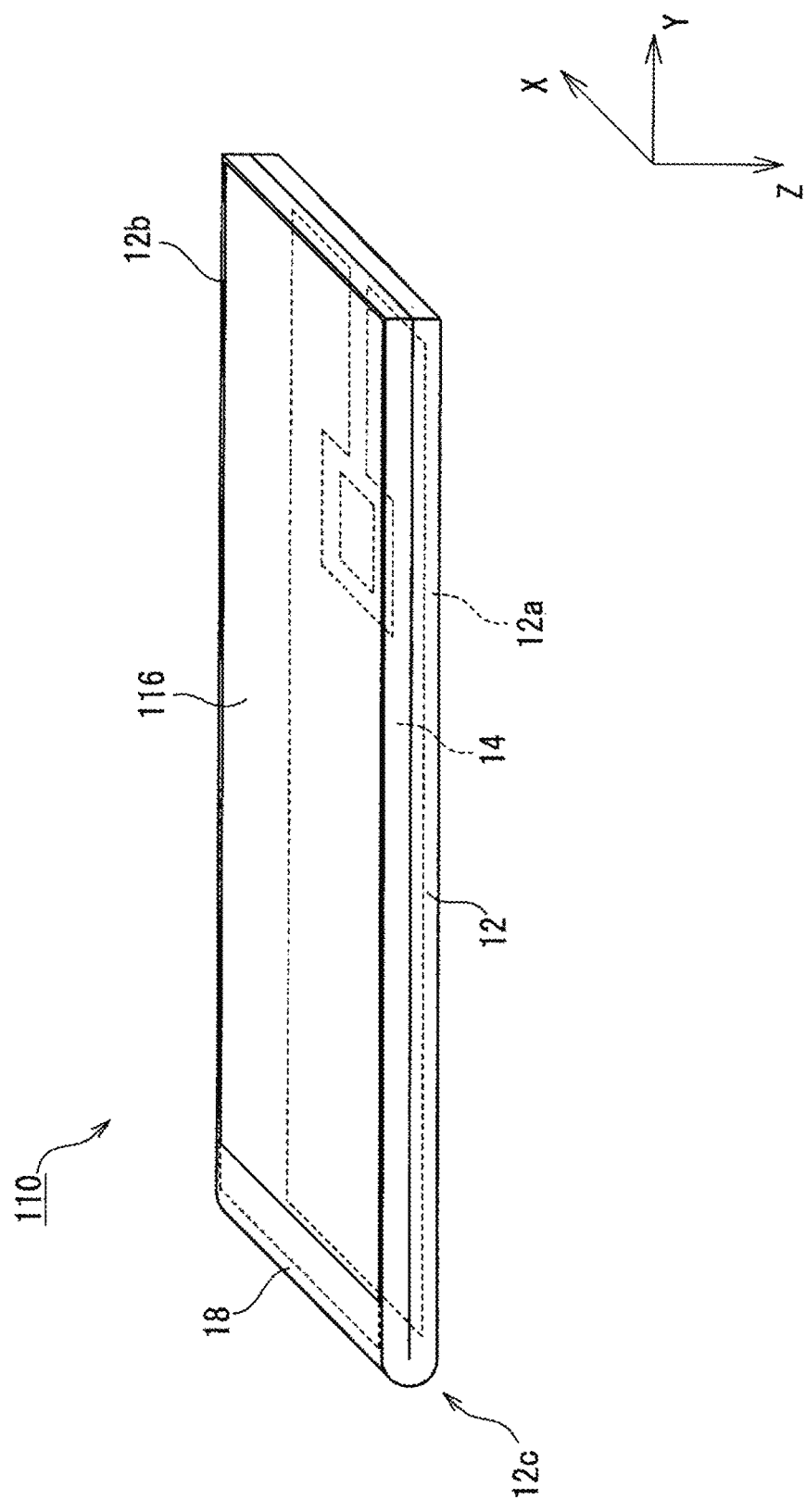
FIG. 8 is a perspective view of a wireless communication device according to another exemplary embodiment as viewed from the second principal surface side.

FIG. 8 shows a wireless communication device according to another embodiment as viewed from the second principal surface side.

As shown in FIG. 8, in a wireless communication device 110 according to the other embodiment, a second conductor pattern 116 is disposed over the entire second principal surface 12b of the base sheet 12. As a result, even if the first conductor pattern 14 is shifted in the width direction (i.e., the X-axis direction) due to folding, the entire first conductor pattern 14 can be opposite to the second conductor pattern 16.

When the second conductor pattern 16 is enlarged, the second conductor pattern 16 and the metal surface Ms are strongly capacitively coupled while the wireless communication device 10 is attached to the metal surface Ms of the article via an insulating double-sided tape. Alternatively, when a conductive double-sided tape is used, the resistance between the second conductor pattern 16 and the metal surface Ms is reduced, and more current flows therebetween.

As a result, stronger radio waves are emitted from the metal surface Ms, and consequently, the communication distance becomes longer.

Moreover, a groove can be disposed in the base sheet (i.e., the base sheet material) so as to suppress variation in folding, i.e., to suppress variation in the position of the first conductor pattern 14 with respect to the second conductor pattern 16.

Figure 9:
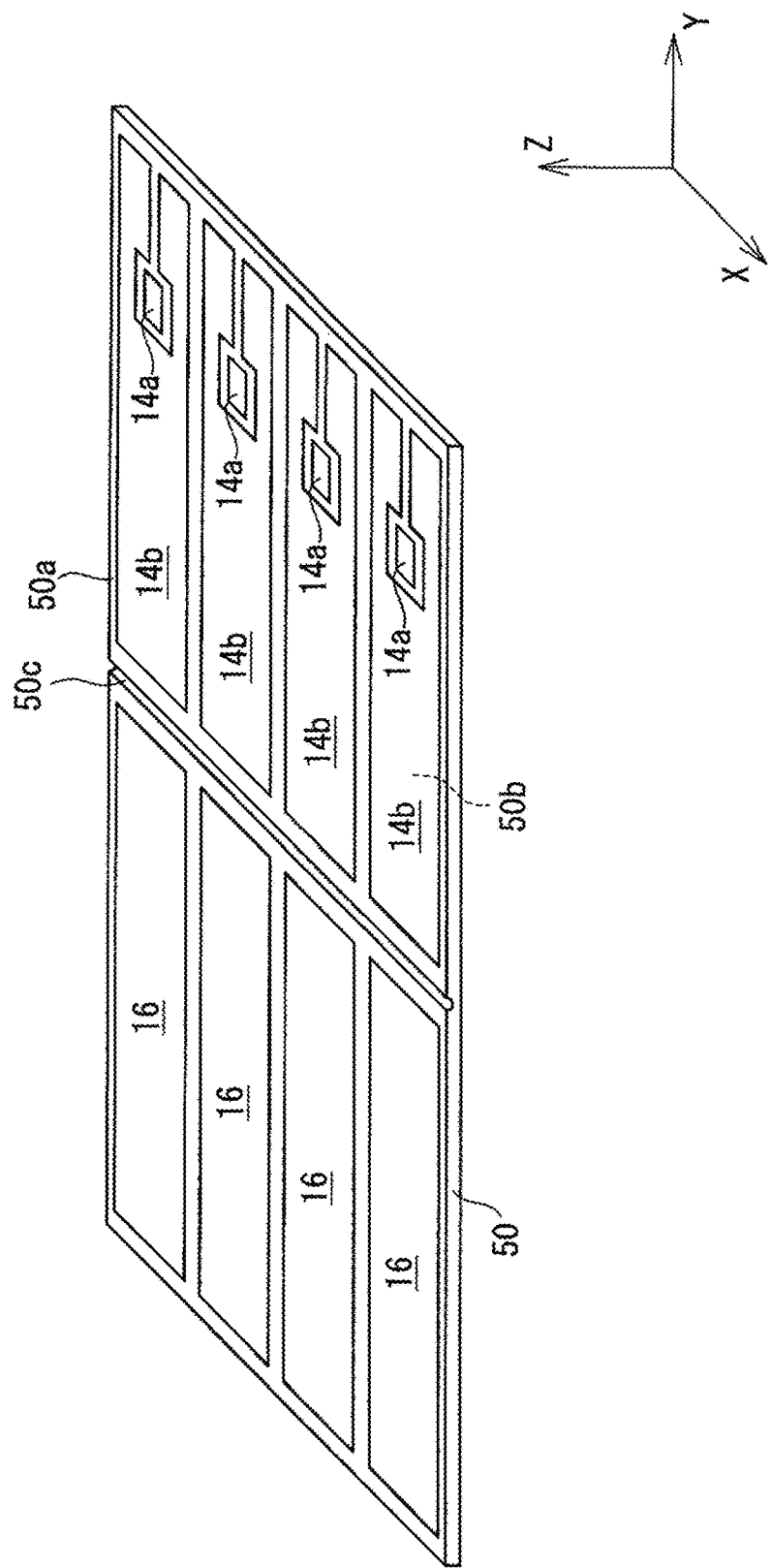
FIG. 9 is a perspective view of a base sheet material in which a groove is formed.

FIG. 9 shows a base sheet material in which a groove is formed.

As shown in FIG. 9, a groove 50c extending in the width direction (i.e., the X-axis direction) of the base sheet material 50 is formed in a portion of the one surface 50a of the base sheet material 50 located between the first and second conductor patterns 14, 16. The groove 50c is disposed at the center of the base sheet material 50 in the longitudinal direction (i.e., the Y-axis direction). By folding the base sheet material 50 along the groove 50c, the occurrence of variation can be suppressed in the folding position. Therefore, variation in the position of the first conductor pattern 14 can be suppressed with respect to the second conductor pattern 16. If the groove 50c as described above is disposed, the first and second conductor patterns 14, 16 can have the same size as viewed in the thickness direction (i.e., the Z-axis direction) of the base sheet 12 (i.e., the base sheet material 50).

It is noted that while the exemplary embodiments of the present invention have been described with the embodiments, the present invention is not limited thereto.

For example, in the case of the embodiments, the base sheet 12 (i.e., the base sheet material 50) is folded and overlapped. However, the embodiments according to the present invention are not limited thereto.

Figure 10:
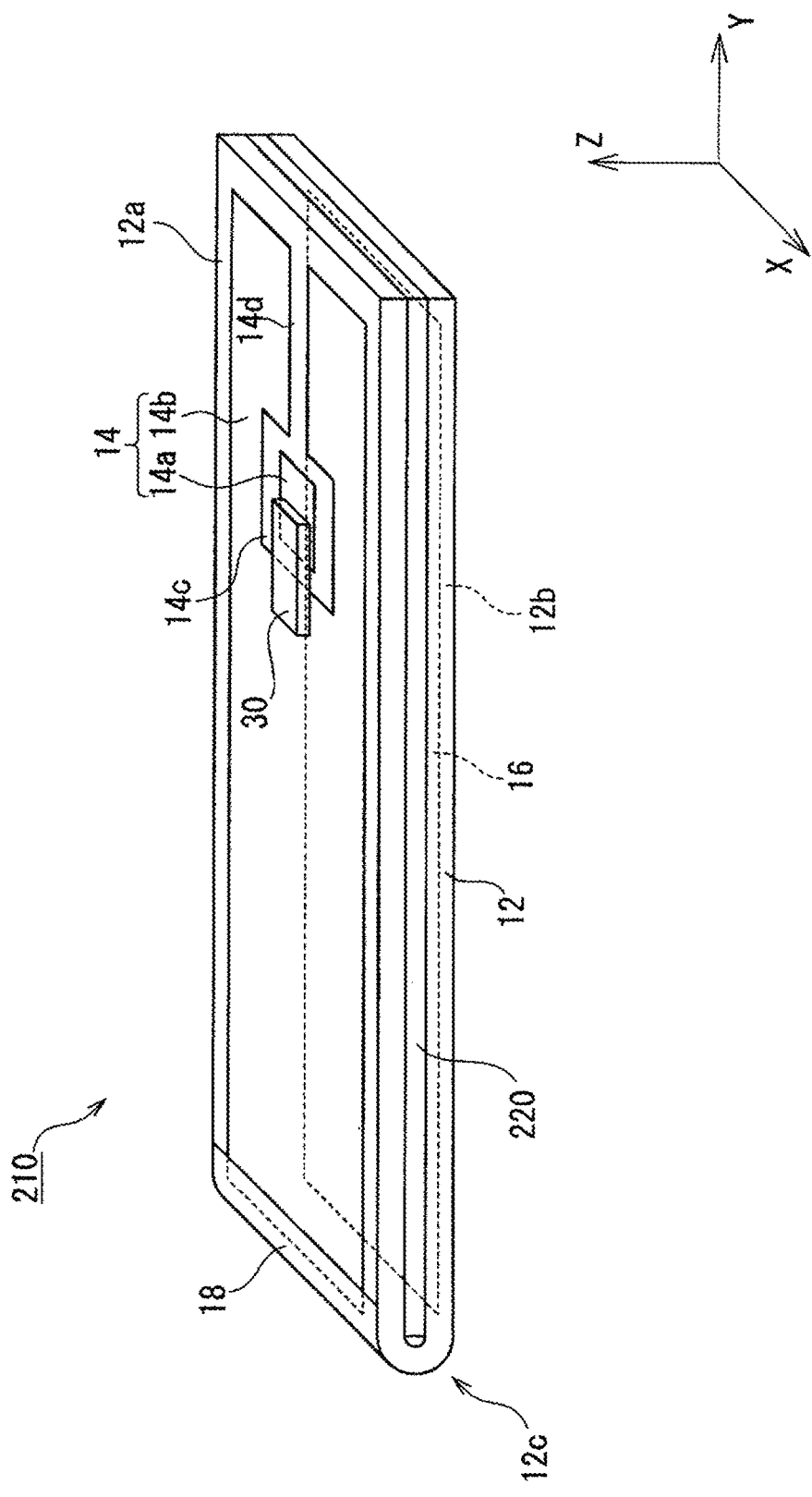
FIG. 10 is a perspective view of a wireless communication device according to a further exemplary embodiment.

FIG. 10 shows a wireless communication device according to a further embodiment.

As shown in FIG. 10, in a wireless communication device 210 according to the further embodiment, the base sheet 12 is folded, and portions facing each other due to the folding sandwich an interposed member 220.

The interposed member 220 is a member having a permittivity lower than the base sheet 12. For example, when the base sheet 12 is a foamed PET film having a permittivity of about 2.0, the interposed member 220 is a foamed olefin film having a permittivity of about 1.1, for example. For example, the interposed member 220 is a member made of the same material as the base sheet 12 and having a foaming ratio higher than the base sheet 12.

The interposed member 220 having a permittivity lower than the base sheet 12 can reduce the capacities C3, C4 between the first conductor pattern 14 and the second conductor pattern 16. Consequently, the communication distance of the wireless communication device 210 becomes longer as compared to when the interposed member 220 is not present.

It is noted that for folding of the base sheet, the base sheet is not limited to being folded in two and may be folded in three. As the number of overlaps of the base sheet increases, the capacity can be made smaller between the first conductor pattern and the second conductor pattern.

In the case of the embodiments, as shown in FIG. 6, the connection conductor material 54 (i.e., the connection conductor 18) is affixed to the base sheet material 50 (i.e., the base sheet 12) with the insulating adhesive 56 interposed therebetween. However, the embodiments according to the present invention are not limited thereto.

Figure 11:
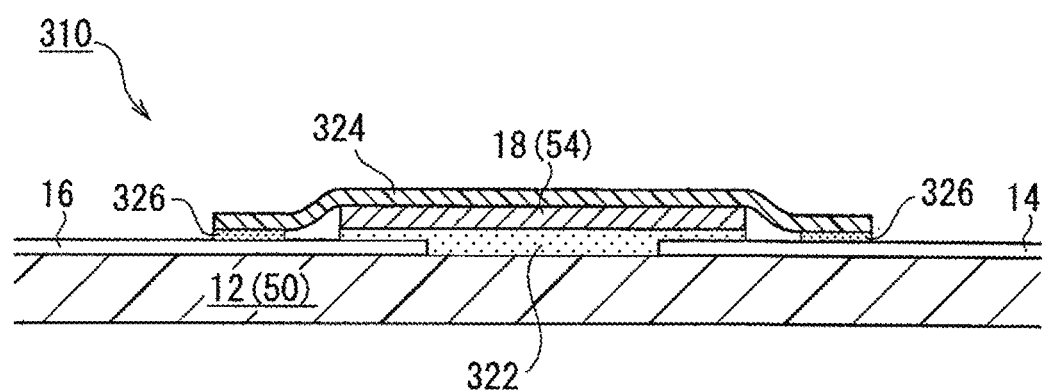
FIG. 11 is a partial cross-sectional view showing attachment of a connection conductor to a base sheet in a wireless communication device according to a different exemplary embodiment.

FIG. 11 is a partial cross-sectional view showing attachment of a connection conductor to a base sheet in a wireless communication device according to a different embodiment.

As shown in FIG. 11, in a wireless communication device 310 according to the different embodiment, the connection conductor 18 (i.e., the connection conductor material 54) is placed on the base sheet 12 (i.e., the base sheet material 50) with an insulating or conductive paste 322 interposed therebetween. Therefore, although electrically connected to the first and second conductor patterns 14, 16, the connection conductor 18 is not fixed and is slidable.

A cover member 324 overlaps the connection conductor 18 so as to maintain the electrical connection between the connection conductor 18 and the first and second conductor patterns 14, 16. An outer circumferential edge of the cover member 324 is affixed to the base sheet 12 and the first and second conductor patterns 14, 16 with an insulating adhesive 326 interposed therebetween. In an exemplary aspect, the cover member 324 and the connection conductor 18 are not bonded to each other and are in contact with each other.

According to the affixing of the connection conductor 18 to the base sheet 12 as described above, when the base sheet 12 is folded together with the connection conductor 18, the connection conductor 18 slides relative to the base sheet 12 and the cover member 324. Since the connection conductor 18 is not fixed to the base sheet 12 or the cover member 324, the connection conductor 18 hardly cracks after being folded.

With regard to the connection conductor, it is noted that the sheet-shaped connection conductor electrically connecting the first conductor pattern and the second conductor pattern is preferably made up of a single conductor of aluminum etc. The sheet-shaped connection conductor may be a conductor produced by forming a conductor layer on a sheet-shaped member such as a resin film. In this case, the connection conductor can be folded with the conductor layer facing inside so that the resin film is located in an outermost circumferential portion having a maximum point of tensile stress, and therefore, the occurrence of cracking of the conductive layer can be suppressed.

Furthermore, it is noted that the exemplary embodiments according to the present invention do not limit the form of the first conductor pattern functioning as the radiating part.

Figure 12:
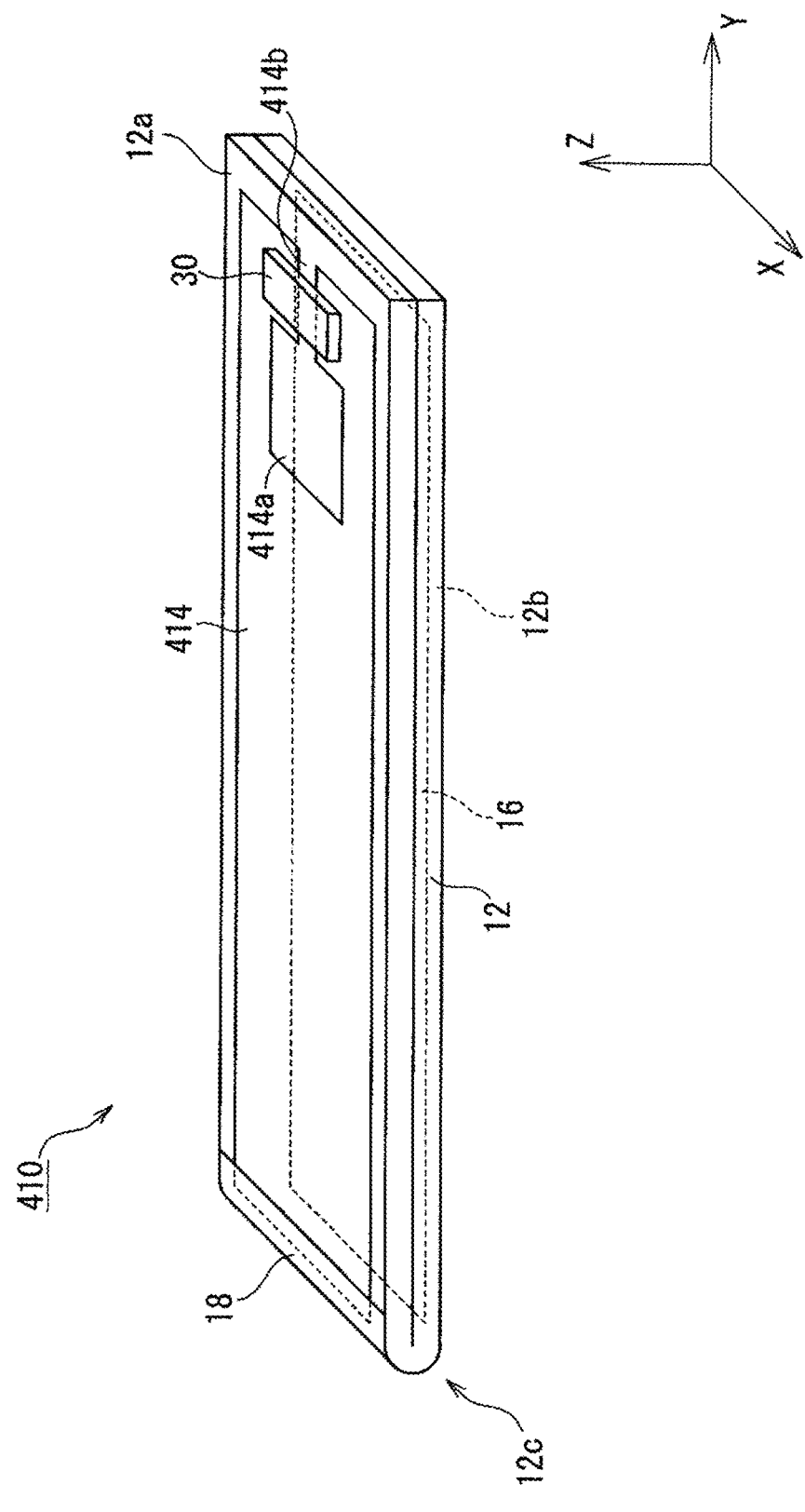
FIG. 12 is a perspective view of an exemplary wireless communication device including a different first conductor pattern.
Figure 13:
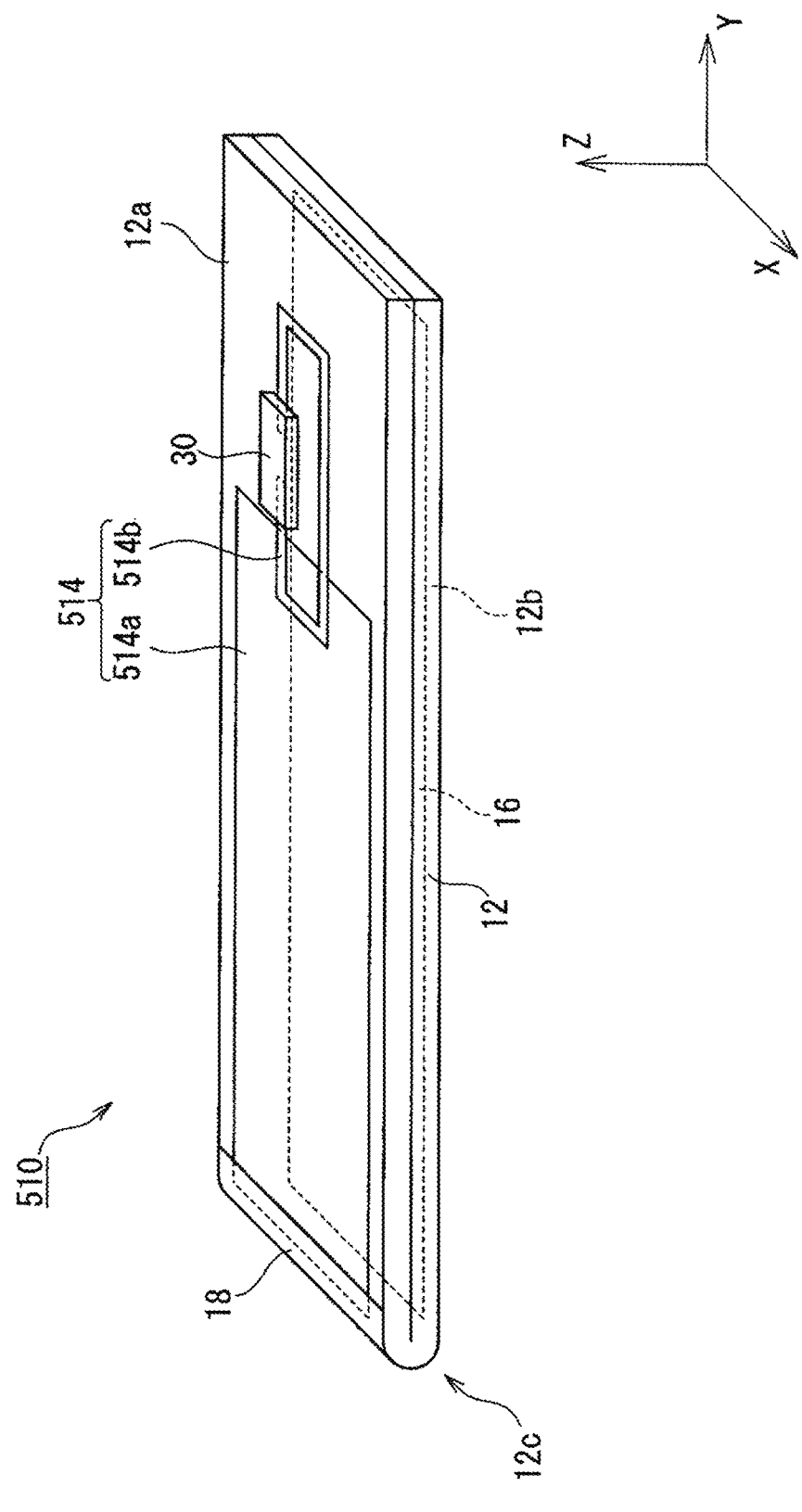
FIG. 13 is a perspective view of another exemplary wireless communication device including a different first conductor pattern.
Figure 14:
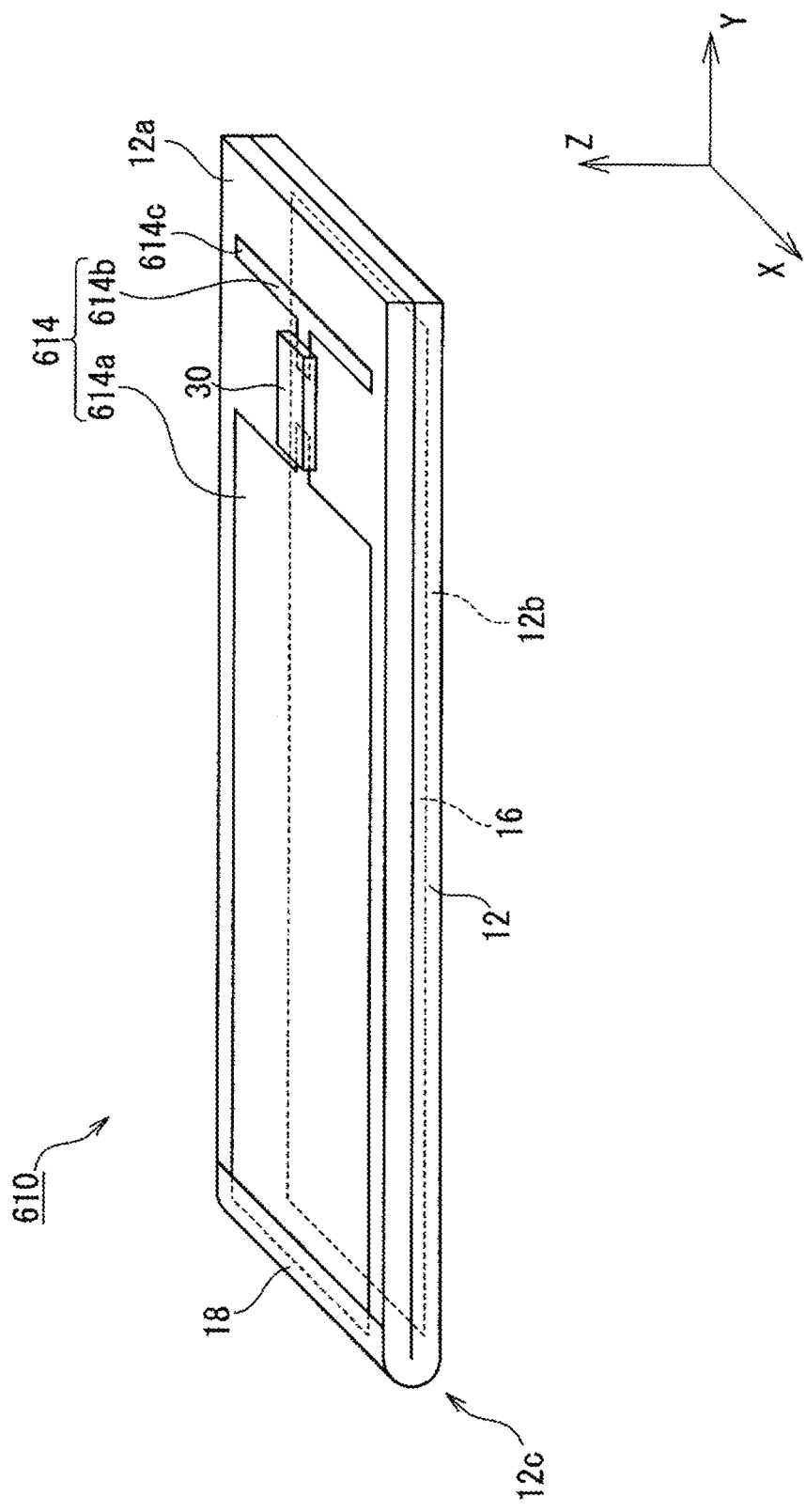
FIG. 14 is a perspective view of a further exemplary wireless communication device including a different first conductor pattern.

FIGS. 12 to 14 each show a wireless communication device including a different first conductor pattern.

As shown in FIG. 12, in an exemplary wireless communication device 410, a first conductor pattern 414 is rectangular and includes an opening part 414a and a slit part 414b extending from the opening part 414a toward one end in the longitudinal direction (i.e., the Y-axis direction) (the end on the side farther from the turning part 12c of the base sheet 12). The RFIC module 30 is disposed on the first conductor pattern 414 so as to straddle the slit part 414b. Specifically, the external connection terminals 38, 40 of the RFIC module 30 are electrically connected to two respective portions of the first conductor patterns 414 facing each other across the slit part 414b.

As shown in FIG. 13, in another exemplary wireless communication device 510, a first conductor pattern 514 is made up of two parts. Specifically, the first conductor pattern 514 includes a belt-shaped conductor pattern 514a and a loop-shaped conductor pattern 514b. The loop-shaped conductor pattern 514b is C-shaped, and both ends thereof are respectively electrically connected to the external connection terminals 38, 40 of the RFIC module 30. The loop-shaped conductor pattern 514b is partially overlapped with the belt-shaped conductor pattern 514a for electrically connecting to the belt-shaped conductor pattern 514a. By adjusting a degree of the overlap, i.e., an area of the belt-shaped conductor pattern 514a covering a loop opening of the loop-shaped conductor pattern 514b, the communication characteristics, for example, the frequency band, of the wireless communication device 510 can be adjusted.

As shown in FIG. 14, in a further exemplary wireless communication device 610, a first conductor pattern 614 is composed of two parts. Specifically, the first conductor pattern 614 includes a belt-shaped conductor pattern 614a and a T-shaped conductor pattern 614b. The T-shaped conductor pattern 614b includes a belt-shaped part 614c extending in the width direction (i.e., the X-axis direction) of the wireless communication device 610. One of the external connection terminals 38, 40 of the RFIC module 30 is electrically connected to a central portion of the belt-shaped part 614c. The other external connection terminal of the RFIC module 30 is electrically connected to one end in the longitudinal direction (i.e., the Y-axis direction) of the belt-shaped conductor pattern 614a (e.g., the end on the side farther from the turning part 12c of the base sheet 12).

As described above, in an exemplary embodiment, a wireless communication device is provided that includes a base sheet in a folded state, a first conductor pattern disposed on a first principal surface of the base sheet, a second conductor pattern disposed on a second principal surface of the base sheet opposite to the first principal surface, an RFIC chip disposed on the base sheet so as to electrically connect to the first conductor pattern, and a sheet-shaped connection conductor affixed to a turning part of the base sheet so as to partially overlap with an end portion of the first conductor pattern near the turning part and an end portion of the second conductor pattern near the turning part.

In another exemplary embodiment as described above, a method of manufacturing a wireless communication device is provided that includes disposing a first conductor pattern and a second conductor pattern separately at an interval on the same surface of a base sheet, affixing a sheet-shaped connection conductor to a portion of the base sheet located between the first conductor pattern and the second conductor pattern so as to partially overlap with an end portion of the first conductor pattern and an end portion of the second conductor pattern separated at an interval, folding the base sheet together with the connection conductor between the first conductor pattern and the second conductor pattern with the first and second conductor patterns facing outward, affixing portions of the base sheet facing each other due to folding to each other, and disposing an RFIC chip on the base sheet so as to electrically connect to the first conductor pattern.

It is generally noted that while some exemplary embodiments of the present invention have been described, it should be apparent for those skilled in the art that at least one exemplary embodiment can entirely or partially be combined with a certain embodiment to form a further embodiment according to the present invention.

EXPLANATIONS OF LETTERS OR NUMERALS

10 wireless communication device
12 base sheet
12a first principal surface
12b second principal surface
12c turning part
14 first conductor pattern
18 connection conductor
30 RFIC module

The invention claimed is:

1. A wireless communication device comprising:
    a base sheet folded at a turning part such that two parts of the base sheet are facing each other;
    a first conductor pattern disposed on a first principal surface of the base sheet;
    a second conductor pattern disposed on a second principal surface of the base sheet that is opposite to the first principal surface;
    an RFIC chip disposed on the base sheet and electrically connected to the first conductor pattern;
    a sheet-shaped connection conductor having a planar surface and disposed above the turning part of the base sheet so as to partially overlap with an end of the first conductor pattern adjacent to the turning part and an end of the second conductor pattern adjacent to the turning part; and
    an insulating adhesive disposed directly on the turning part of base sheet and between the respective ends of the first and second conductor patterns,
    wherein the sheet-shaped connection conductor is disposed directly on the insulating adhesive opposite to the turning part of the base sheet, such that the sheet-shaped connection conductor is capacitively coupled to the respective ends of the first and second conductor patterns.

2. The wireless communication device according to claim 1, wherein the first principal surface is an outer surface of a first of the two parts of the base sheet and the second principal surface is an outer surface of a second of the two parts of the base sheet, such that the first and second principal surfaces face away from each other.

3. The wireless communication device according to claim 1, wherein the sheet-shaped connection conductor comprises a thickness greater than a thickness of each of the first and second conductor patterns.

4. The wireless communication device according to claim 1, wherein the sheet-shaped connection conductor comprises a width greater than a width of each of the first and second conductor patterns.

5. The wireless communication device according to claim 1, wherein the two parts of the base sheet facing each other sandwich an interposed member having a permittivity lower than the base sheet.

6. The wireless communication device according to claim 1, further comprising an RFIC module that includes the RFIC chip and a matching circuit, with the RFIC module disposed on the base sheet so that the RFIC chip is electrically connected to the first conductor pattern via the matching circuit.

7. The wireless communication device according to claim 6, wherein the first conductor pattern comprises a first electrode and a second electrode that surrounds the first electrode with a space defined therebetween, such that the RFIC module is electrically connected between the first and second electrodes.

8. The wireless communication device according to claim 1, wherein the sheet-shaped connection conductor overlaps the respective ends of the first and second conductor patterns in a thickness direction of the base sheet.

9. A method of manufacturing a wireless communication device comprising:
    disposing a first conductor pattern and a second conductor pattern separately at an interval on a same surface of a base sheet;

disposing an insulating adhesive directly on a turning part of the base sheet between respective ends of the first and second conductor patterns;

affixing a sheet-shaped connection conductor having a planar surface to the base sheet located between the first and second conductor patterns so that the sheet-shaped connection conductor partially overlaps respective ends of the first and second conductor patterns that face each other and are separated at the interval, such that the sheet-shaped connection conductor is directly coupled to the insulating adhesive and opposite to the turning part of the base sheet, such that the sheet-shaped connection conductor is capacitively coupled to the respective ends of the first and second conductor patterns;

folding the base sheet together with the sheet-shaped connection conductor at the turning part between the first conductor pattern and the second conductor pattern, such that the first and second conductor patterns face outward from each other after the base sheet is folded; and disposing an RFIC chip on the base sheet that is electrically connected to the first conductor pattern.

10. The method of manufacturing a wireless communication device according to claim 9, further comprising affixing two parts of the base sheet that face each other after the base sheet is folded to each other.

11. The method of manufacturing a wireless communication device according to claim 9, further comprising providing the sheet-shaped connection conductor to have a thickness that is larger than a thickness of each of the first and second conductor patterns.

12. The method of manufacturing a wireless communication device according to claim 9, further comprising providing the sheet-shaped connection conductor to have a width that is larger than a width of each of the first and second conductor patterns.

13. The method of manufacturing a wireless communication device according to claim 10, further comprising providing an interposed member between the two parts of the base sheet that face each other, such that the interposed member is sandwiched between the two parts of the base sheet and wherein the interposed member has a permittivity lower than a permittivity of the base sheet.

14. The method of manufacturing a wireless communication device according to claim 9, wherein the wireless communication device includes an RFIC module that includes the RFIC chip and a matching circuit, such that the RFIC module is disposed on the base sheet so that the RFIC chip is electrically connected to the first conductor pattern via the matching circuit.

15. The method of manufacturing a wireless communication device according to claim 14, further comprising etching the first conductor pattern to form a first electrode and a second electrode that surrounds the first electrode with a space defined therebetween by the etching, with the RFIC module being electrically connected between the first and second electrodes when disposed on the base sheet.

16. The method of manufacturing a wireless communication device according to claim 9, further comprising:
folding the base sheet together with the sheet-shaped connection conductor before completion of curing of the adhesive.

17. The method of manufacturing a wireless communication device according to claim 9, further comprising providing the second conductor pattern to have a surface area larger than a surface area of the first conductor pattern as viewed in a thickness direction of the base sheet.

18. The method of manufacturing a wireless communication device according to claim 9, further comprising:
disposing a groove in a portion of the base sheet located between the first and second conductor patterns; and
folding the base sheet along the groove.

19. The method of manufacturing a wireless communication device according to claim 9, further comprising:
arranging multiple sets of the first and second conductor patterns on a base sheet material side by side in a direction orthogonal to a direction of arrangement of the first conductor pattern and the corresponding second conductor pattern;
affixing a continuous belt-shaped connection conductor material to a portion of the base sheet material located between the first and second conductor patterns so as to partially overlap with respective ends of the first and second conductor patterns separated at an interval in each set;
folding the base sheet material together with the continuous belt-shaped connection conductor material between the first conductor pattern and the second conductor pattern in each set, such that the first and second conductor patterns face outward from each other after the base sheet material is folded;
affixing portions of the base sheet material facing each other due to folding to each other;
disposing a plurality of the RFIC chips on the base sheet material so that each RFIC chip is electrically connect to a respective first conductor pattern of the plurality of the first conductor patterns; and
cutting the base sheet material in a folded state provided with the plurality of the RFIC chips into a plurality of wireless communication devices.

20. The method of manufacturing a wireless communication device according to claim 19, wherein the base sheet material is a roll sheet.

* * * * *